(12) United States Patent
Kai et al.

(10) Patent No.: US 10,290,643 B1
(45) Date of Patent: May 14, 2019

(54) THREE-DIMENSIONAL MEMORY DEVICE CONTAINING FLOATING GATE SELECT TRANSISTOR

(71) Applicant: SANDISK TECHNOLOGIES LLC, Plano, TX (US)

(72) Inventors: James Kai, Santa Clara, CA (US); Johann Alsmeier, San Jose, CA (US); Yanli Zhang, San Jose, CA (US); Peng Zhang, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/876,884

(22) Filed: Jan. 22, 2018

(51) Int. Cl.
| | |
|---|---|
| *H01L 27/11* | (2006.01) |
| *H01L 29/78* | (2006.01) |
| *H01L 27/11524* | (2017.01) |
| *H01L 27/11556* | (2017.01) |
| *H01L 21/28* | (2006.01) |
| *H01L 27/11548* | (2017.01) |
| *H01L 29/788* | (2006.01) |
| *H01L 27/11529* | (2017.01) |
| *H01L 27/11551* | (2017.01) |
| *H01L 27/11582* | (2017.01) |
| *H01L 27/11578* | (2017.01) |

(52) U.S. Cl.
CPC .. *H01L 27/11524* (2013.01); *H01L 21/28273* (2013.01); *H01L 27/11529* (2013.01); *H01L 27/11548* (2013.01); *H01L 27/11556* (2013.01); *H01L 29/7883* (2013.01); *H01L 27/11551* (2013.01); *H01L 27/11578* (2013.01); *H01L 27/11582* (2013.01)

(58) Field of Classification Search
CPC ............................ H01L 27/11551–1556; H01L 27/11578–11582; H01L 27/11524; H01L 27/11529; H01L 27/11548; H01L 29/7883
See application file for complete search history.

(56) References Cited

U.S. PATENT DOCUMENTS

| | | | |
|---|---|---|---|
| 5,915,167 A | 6/1999 | Leedy | |
| 7,906,818 B2 * | 3/2011 | Pekny | ............... H01L 27/11568 257/390 |
| 8,722,525 B2 * | 5/2014 | Sinha | ................. H01L 21/31111 438/593 |
| 8,946,810 B2 * | 2/2015 | Alsmeier | ........... H01L 27/11551 257/326 |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 15/286,063, filed Oct. 5, 2016, Sandisk Technologies LLC.

(Continued)

*Primary Examiner* — Ida M Soward
(74) *Attorney, Agent, or Firm* — The Marbury Law Group, PLLC

(57) ABSTRACT

A three-dimensional memory device includes an alternating stack of insulating layers and control gate electrodes located over a substrate, a drain select gate device located above the alternating stack, and a vertical semiconductor channel extending through the alternating stack and through the drain select gate device. The drain select gate device contains a floating gate electrode located between the vertical semiconductor channel and a first drain select gate electrode.

11 Claims, 27 Drawing Sheets

(56) References Cited

U.S. PATENT DOCUMENTS

| | | | |
|---|---|---|---|
| 9,431,409 B2* | 8/2016 | Lee | H01L 21/764 |
| 9,530,787 B2 | 12/2016 | Tsutsumi et al. | |
| 9,818,759 B2* | 11/2017 | Kai | H01L 27/11524 |
| 9,859,363 B2* | 1/2018 | Lu | H01L 29/0649 |
| 9,972,641 B1* | 5/2018 | Zhang | H01L 27/11582 |
| 10,014,319 B1* | 7/2018 | Bandyopadhyay | H01L 23/528 |
| 10,083,982 B2* | 9/2018 | Shigemura | H01L 27/11582 |
| 10,090,318 B2* | 10/2018 | Zhu | H01L 27/11582 |
| 10,115,730 B1* | 10/2018 | Baraskar | H01L 27/11582 |
| 2015/0371925 A1* | 12/2015 | Thimmegowda | H01L 27/1157 257/751 |
| 2016/0111438 A1 | 4/2016 | Tsutsumi et al. | |
| 2017/0236896 A1 | 8/2017 | Lu et al. | |
| 2017/0373078 A1* | 12/2017 | Chu | H01L 21/76802 |
| 2017/0373087 A1* | 12/2017 | Ito | H01L 27/11582 |
| 2018/0108671 A1* | 4/2018 | Yu | H01L 27/11575 |
| 2018/0197876 A1* | 7/2018 | Ge | H01L 27/11582 |
| 2018/0247954 A1* | 8/2018 | Amano | H01L 21/02186 |
| 2018/0261613 A1* | 9/2018 | Ariyoshi | H01L 23/5226 |
| 2019/0027489 A1* | 1/2019 | Orimoto | H01L 23/5226 |
| 2019/0067025 A1* | 2/2019 | Yada | H01L 21/30608 |

OTHER PUBLICATIONS

U.S. Appl. No. 15/354,067, filed Nov. 17, 2016, Sandisk Technologies LLC.
U.S. Appl. No. 15/354,795, filed Nov. 17, 2016, Sandisk Technologies LLC.
U.S. Appl. No. 15/468,732, filed Mar. 24, 2017, Sandisk Tehcnologies LLC.
U.S. Appl. No. 15/496,359, filed Apr. 25, 2017, Sandisk Technologies LLC.
U.S. Appl. No. 15/628,495, filed Jun. 20, 2017, Sandisk Technologies LLC.
U.S. Appl. No. 15/685,254, filed Aug. 24, 2017, Sandisk Technologies LLC.
U.S. Appl. No. 15/704,286, filed Sep. 14, 2017, Sandisk Technologies LLC.
U.S. Appl. No. 15/784,549, filed Oct. 16, 2017, Sandisk Technologies LLC.
U.S. Appl. No. 15/818,061, filed Nov. 20, 2017, Sandisk Technologies LLC.
U.S. Appl. No. 15/818,146, filed Nov. 20, 2017, Sandisk Technologies LLC.
U.S. Appl. No. 15/850,073, filed Dec. 21, 2017, Sandisk Technologies LLC.

* cited by examiner

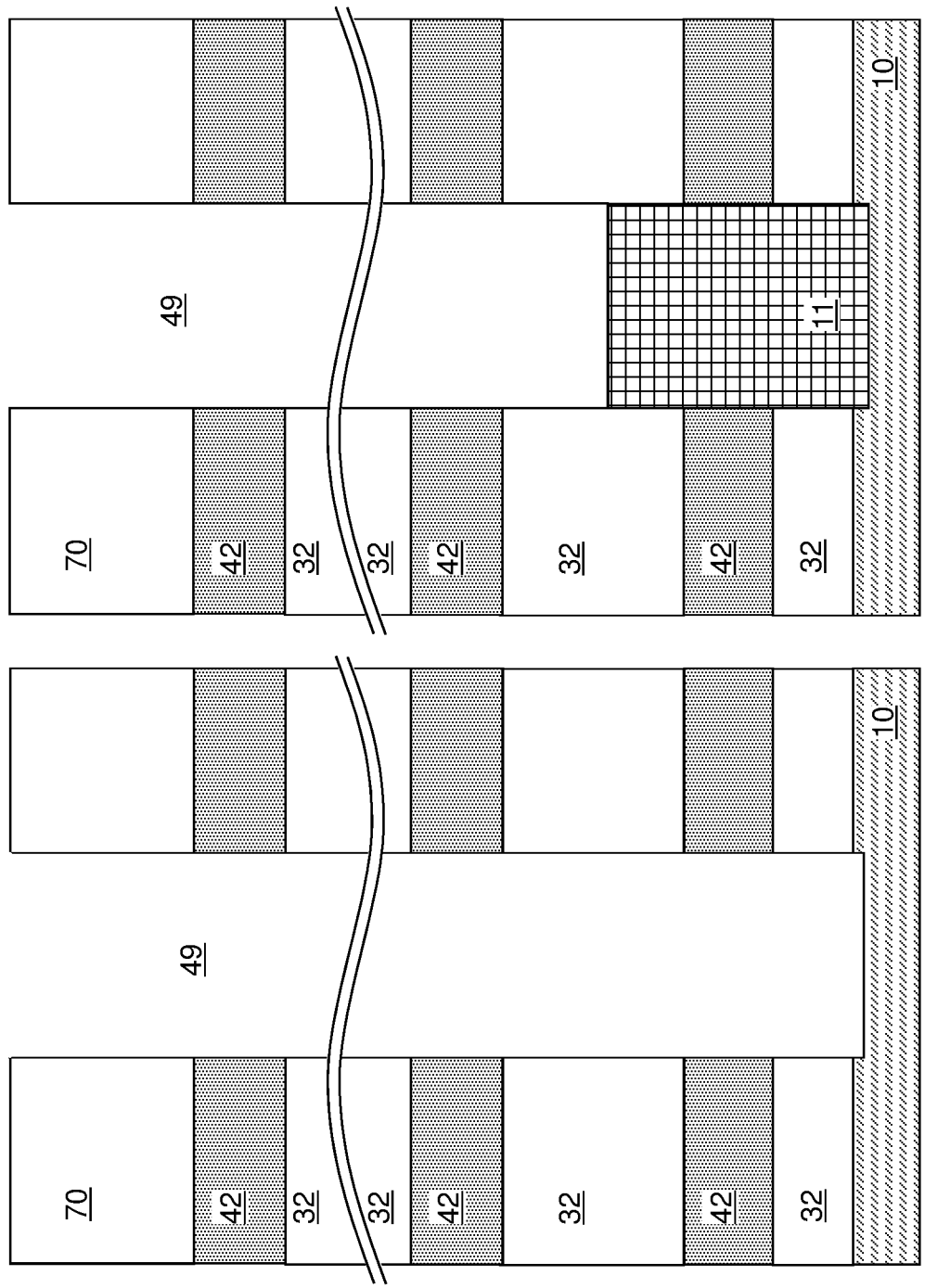

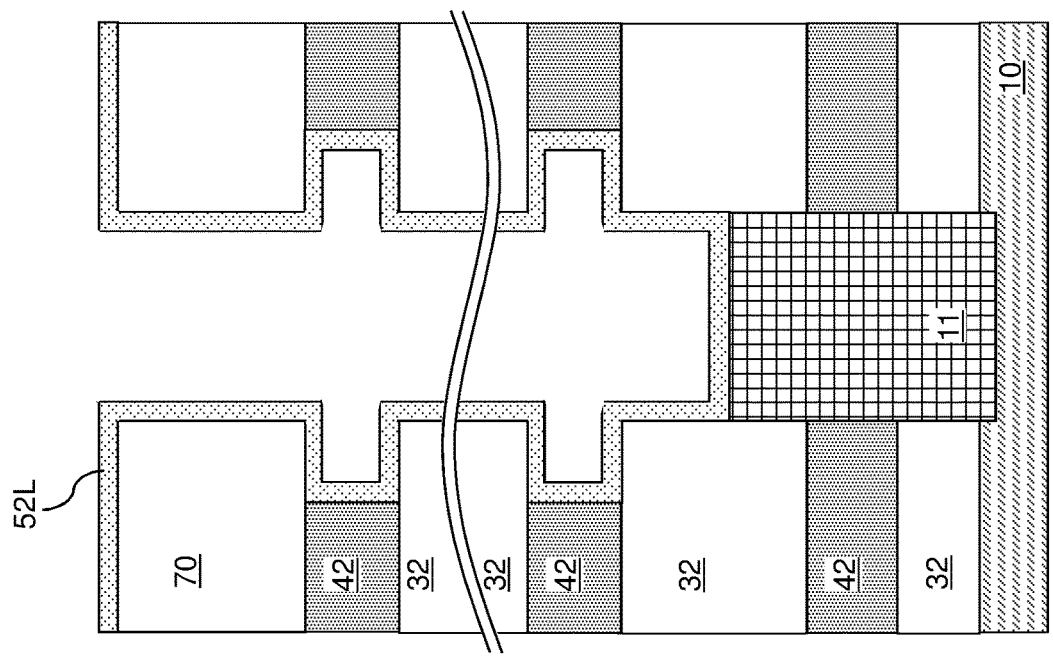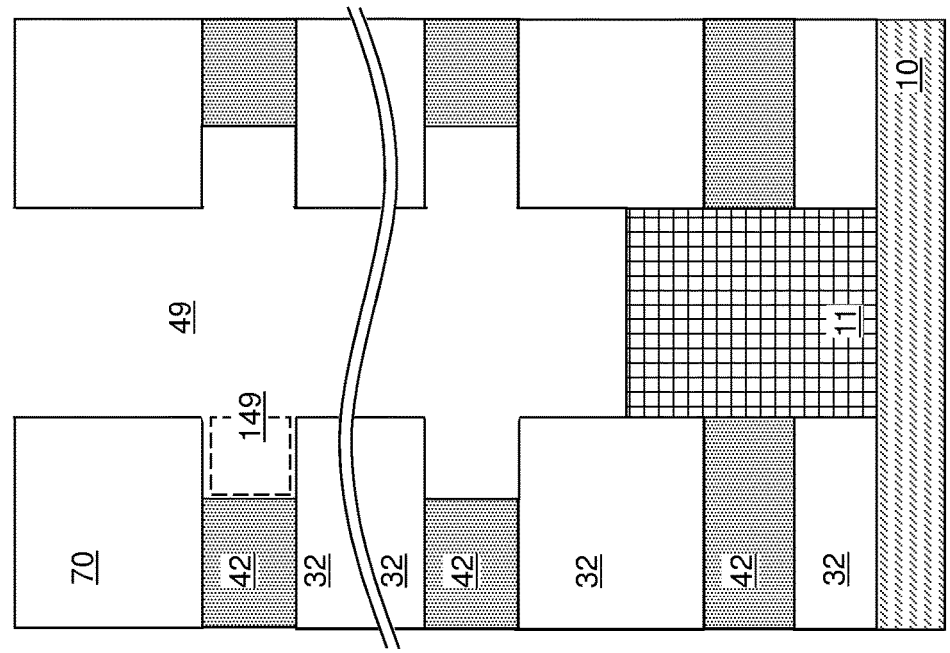

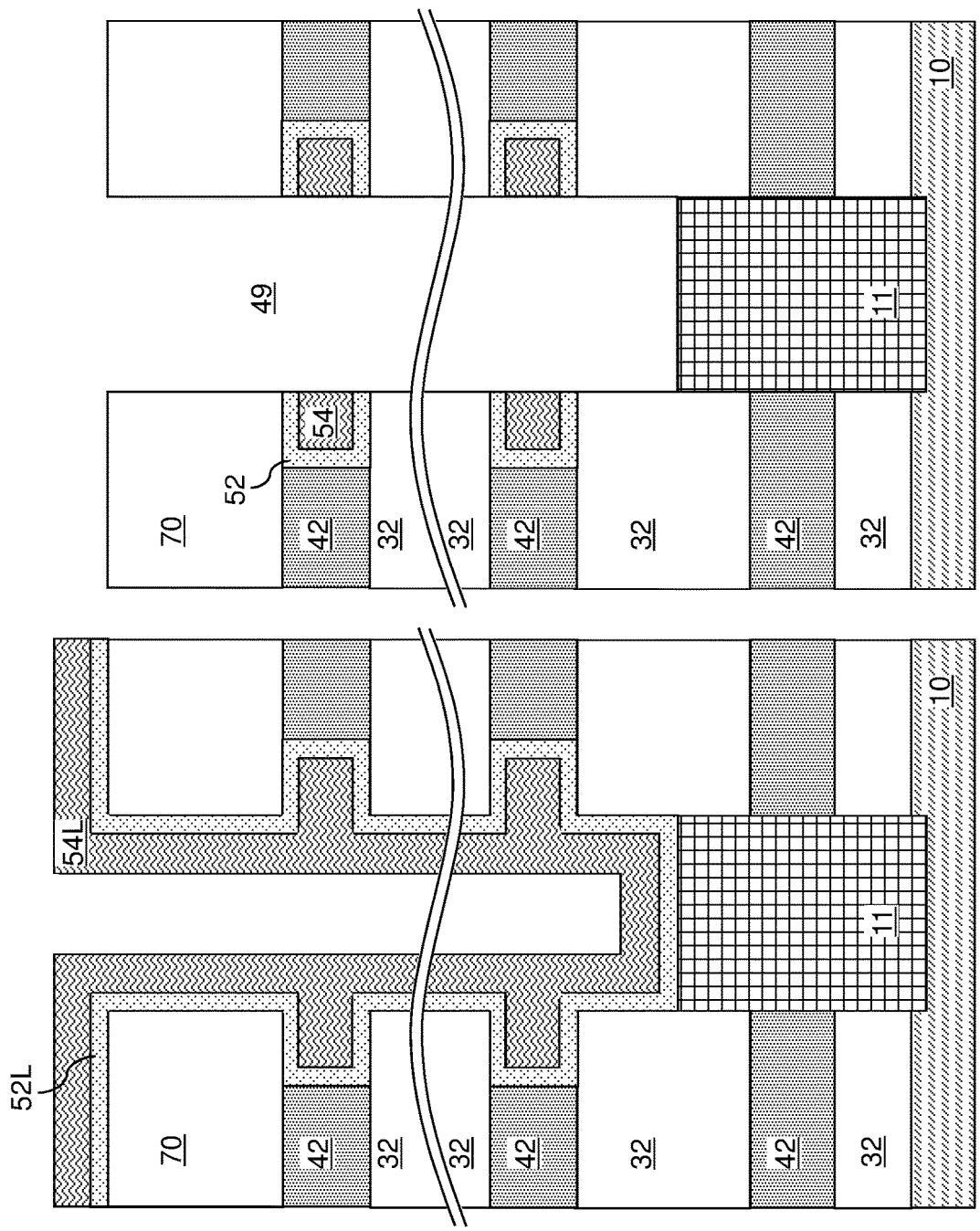

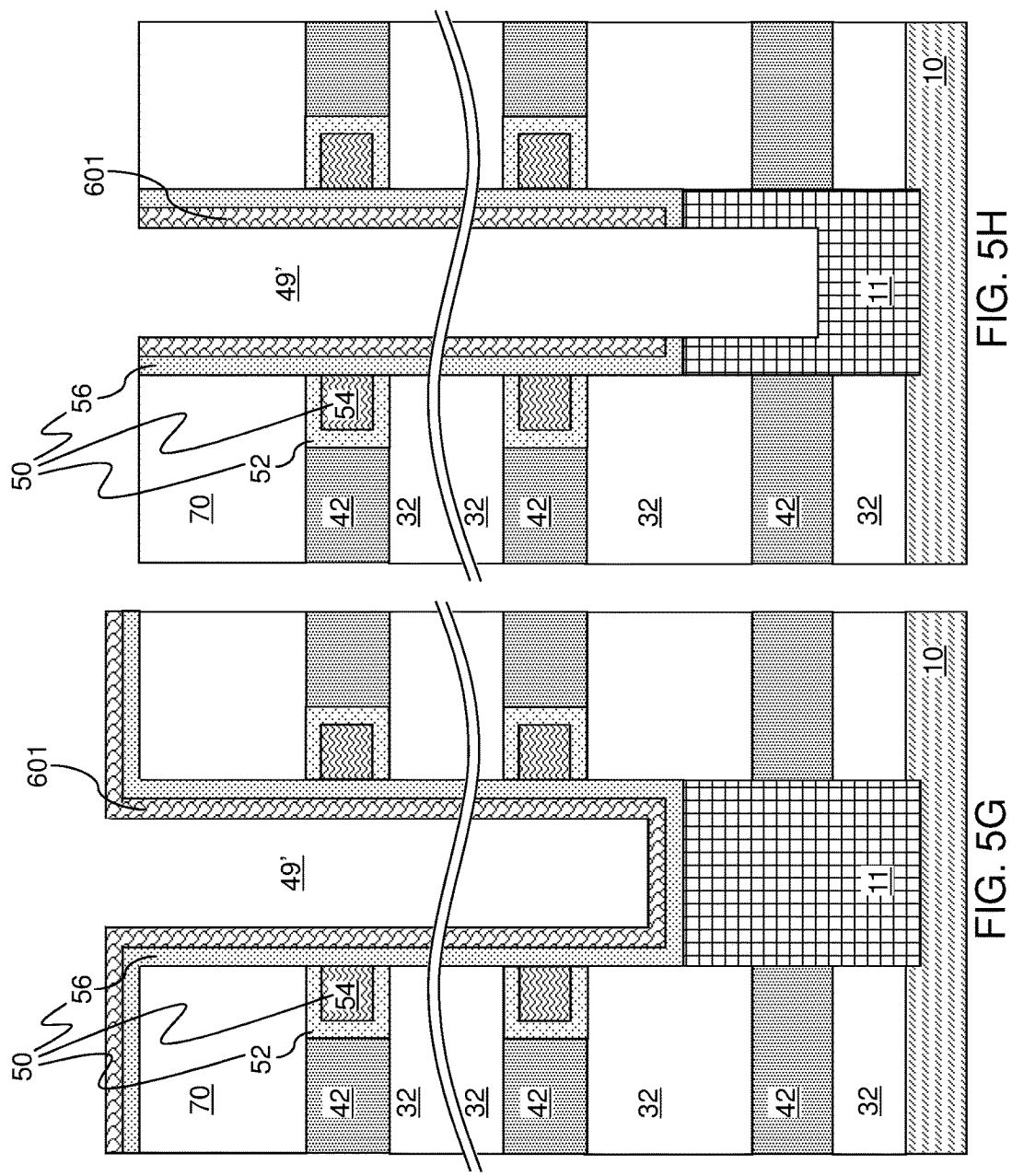

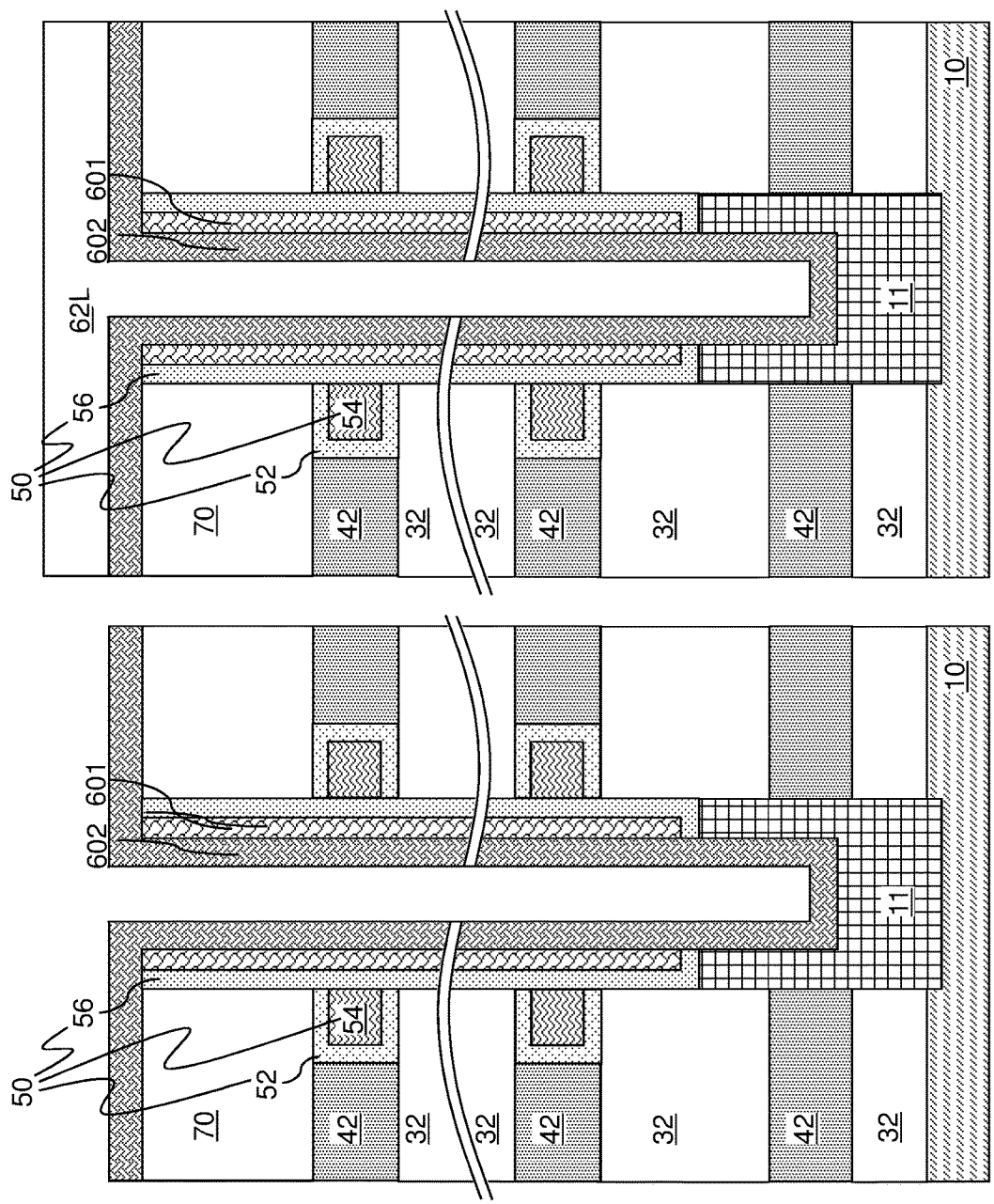

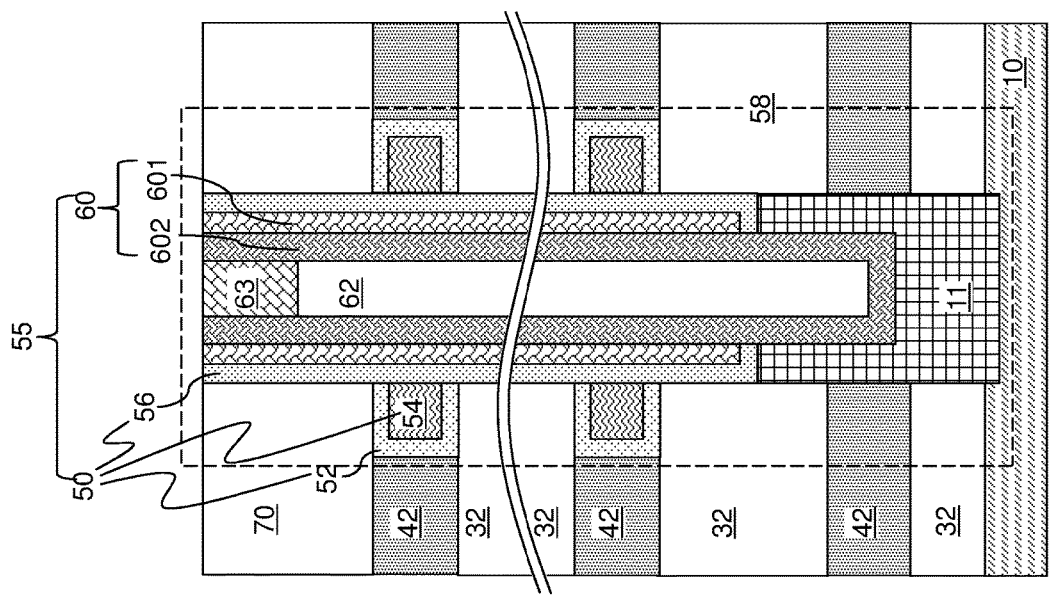
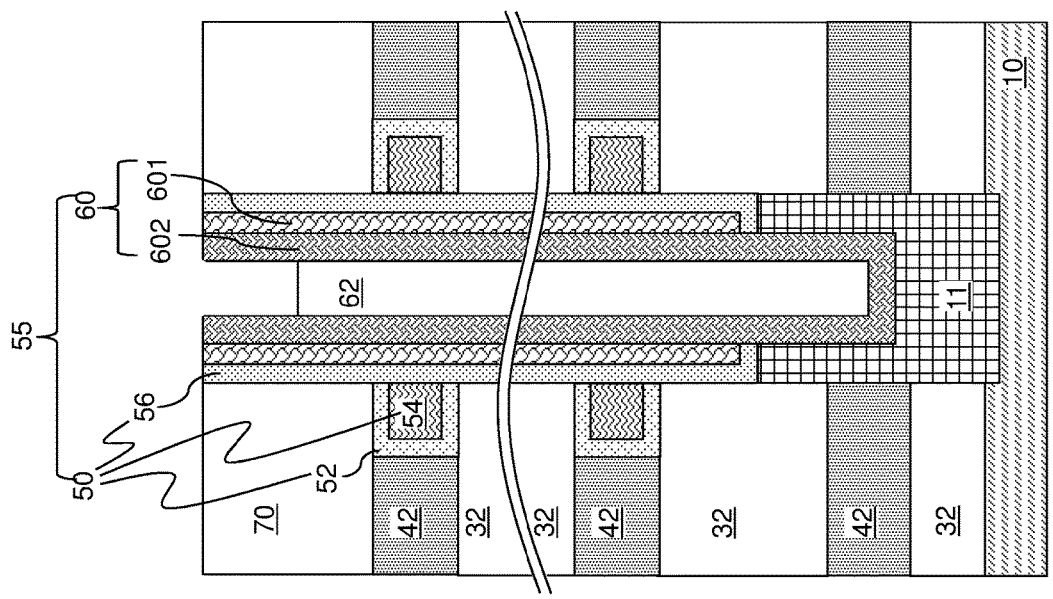

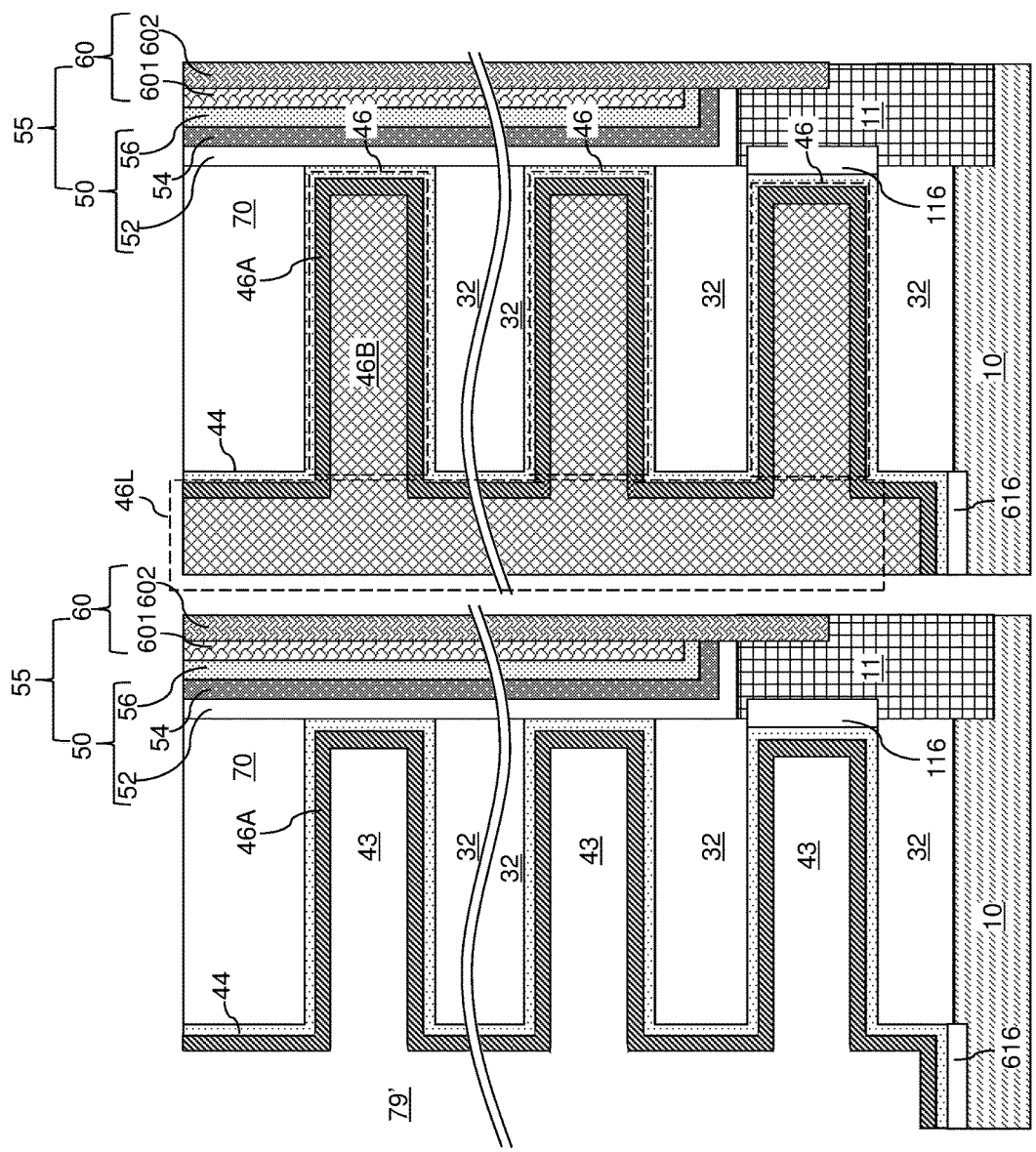

ABSTRACT# THREE-DIMENSIONAL MEMORY DEVICE CONTAINING FLOATING GATE SELECT TRANSISTOR

FIELD

The present disclosure relates generally to the field of semiconductor devices, and particular to a three-dimensional memory device employing floating gate select transistors and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and control gate electrodes located over a substrate, a drain select gate device located above the alternating stack, and a vertical semiconductor channel extending through the alternating stack and through the drain select gate device. The drain select gate device contains a floating gate electrode located between the vertical semiconductor channel and a first drain select gate electrode.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming memory stack structures through the alternating stacks, wherein each of the memory stack structures comprises floating gate electrodes laterally surrounding a vertical semiconductor channel and spaced from the electrically conductive layers by a respective blocking dielectric; and forming dielectric isolation structures in the alternating stack, wherein each of the dielectric isolation structures comprises a dielectric material which divides a topmost spacer material layer into discrete portions, wherein a subset of the floating gate electrodes located at a level of the topmost spacer material layer directly contacts a respective sidewall of the dielectric isolation structures.

BRIEF DESCRIPTION OF THE DRAWINGS

FIGS. 5A-5L are sequential schematic vertical cross-sectional views of a memory opening within the exemplary structure during formation of a memory stack structure, an optional dielectric core, and a drain region according to an embodiment of the present disclosure.

FIGS. 11A-11D are sequential vertical cross-sectional views of a region of the exemplary structure during formation of electrically conductive layers according to an embodiment of the present disclosure.

DETAILED DESCRIPTION

Figure 1:
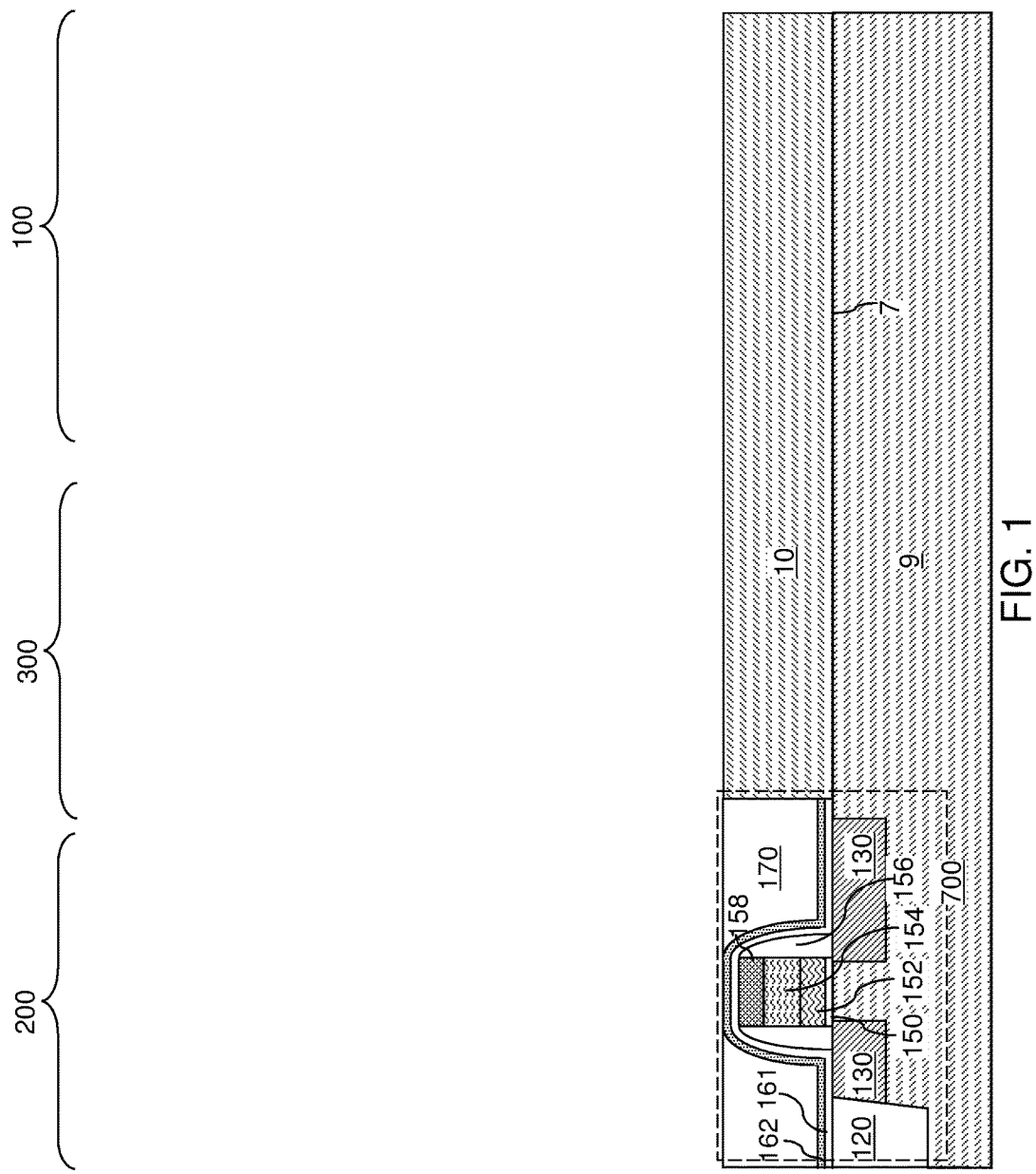
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing floating gate select devices and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
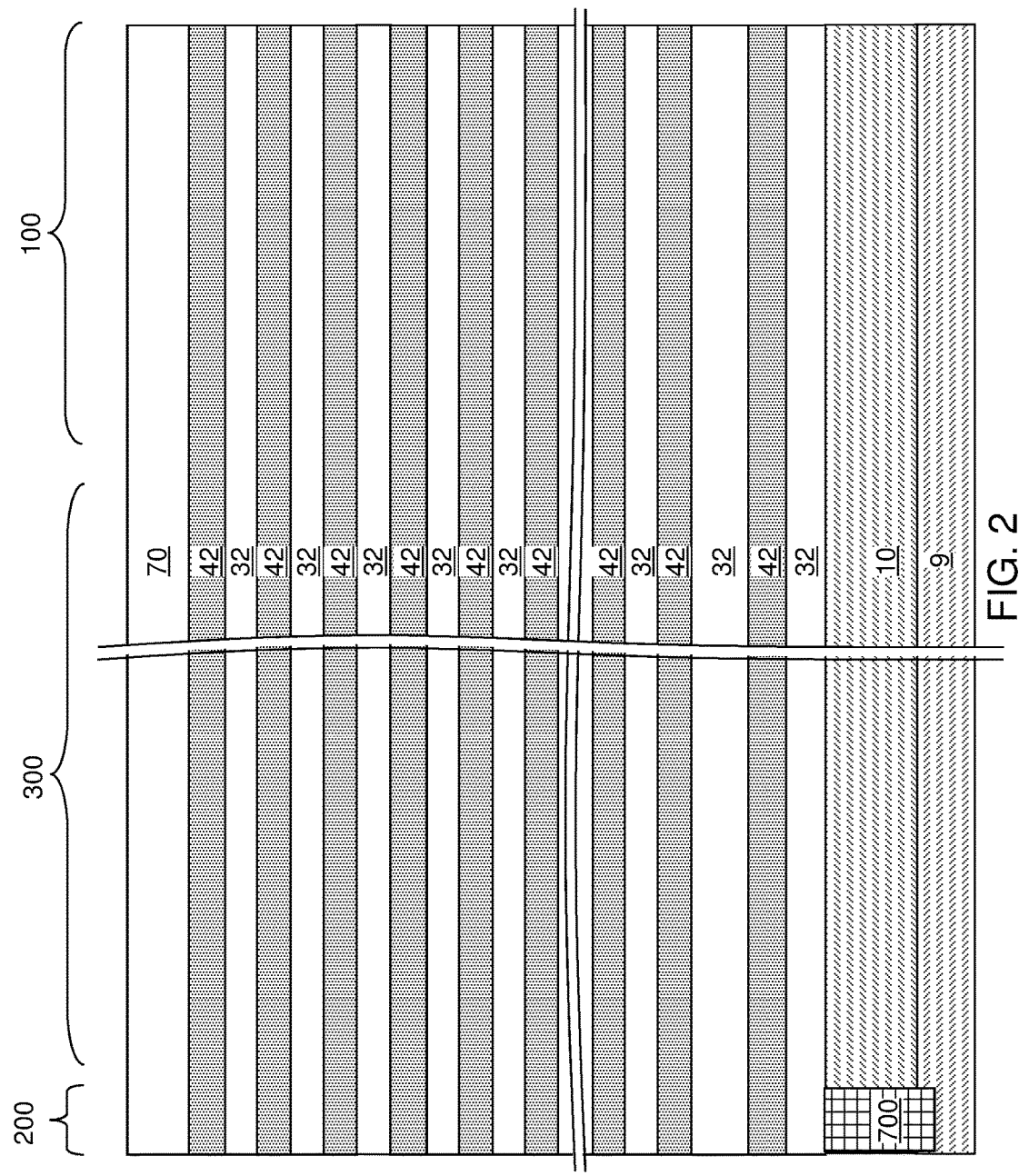
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
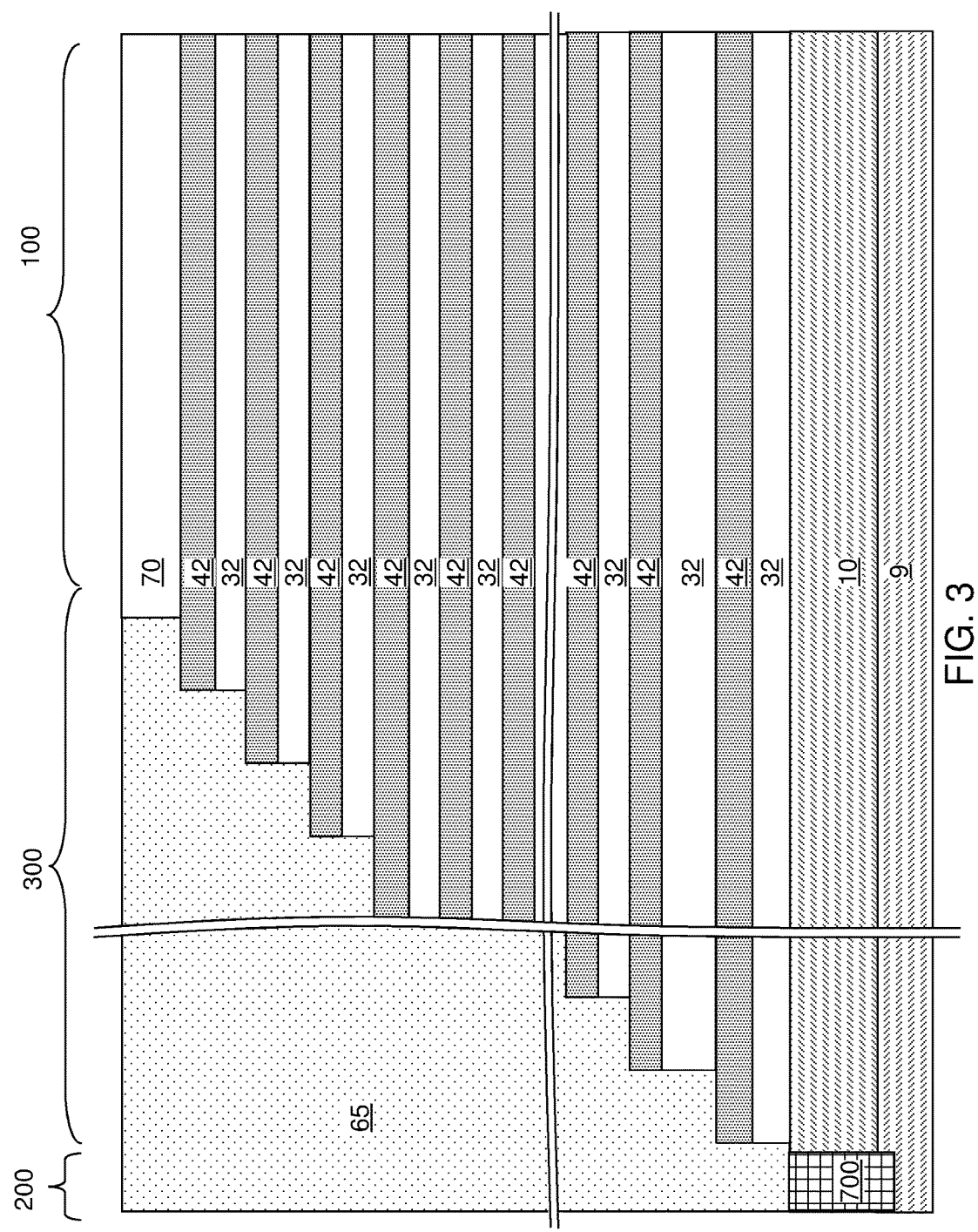
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity over the terrace region by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
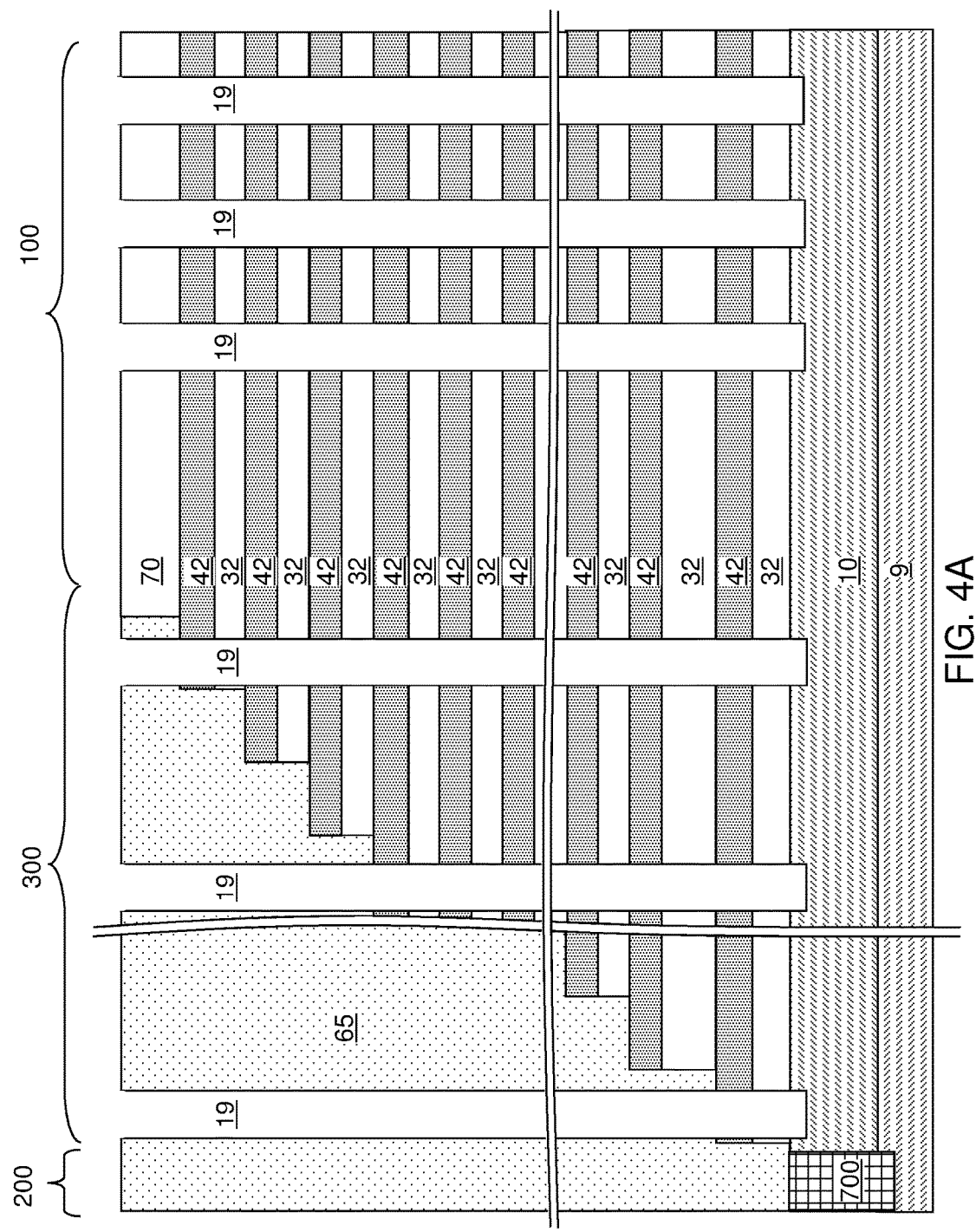
FIG. 4A is a schematic vertical cross-sectional view of the exemplary structure after formation of memory openings and support openings according to an embodiment of the present disclosure.
Figure 4B:
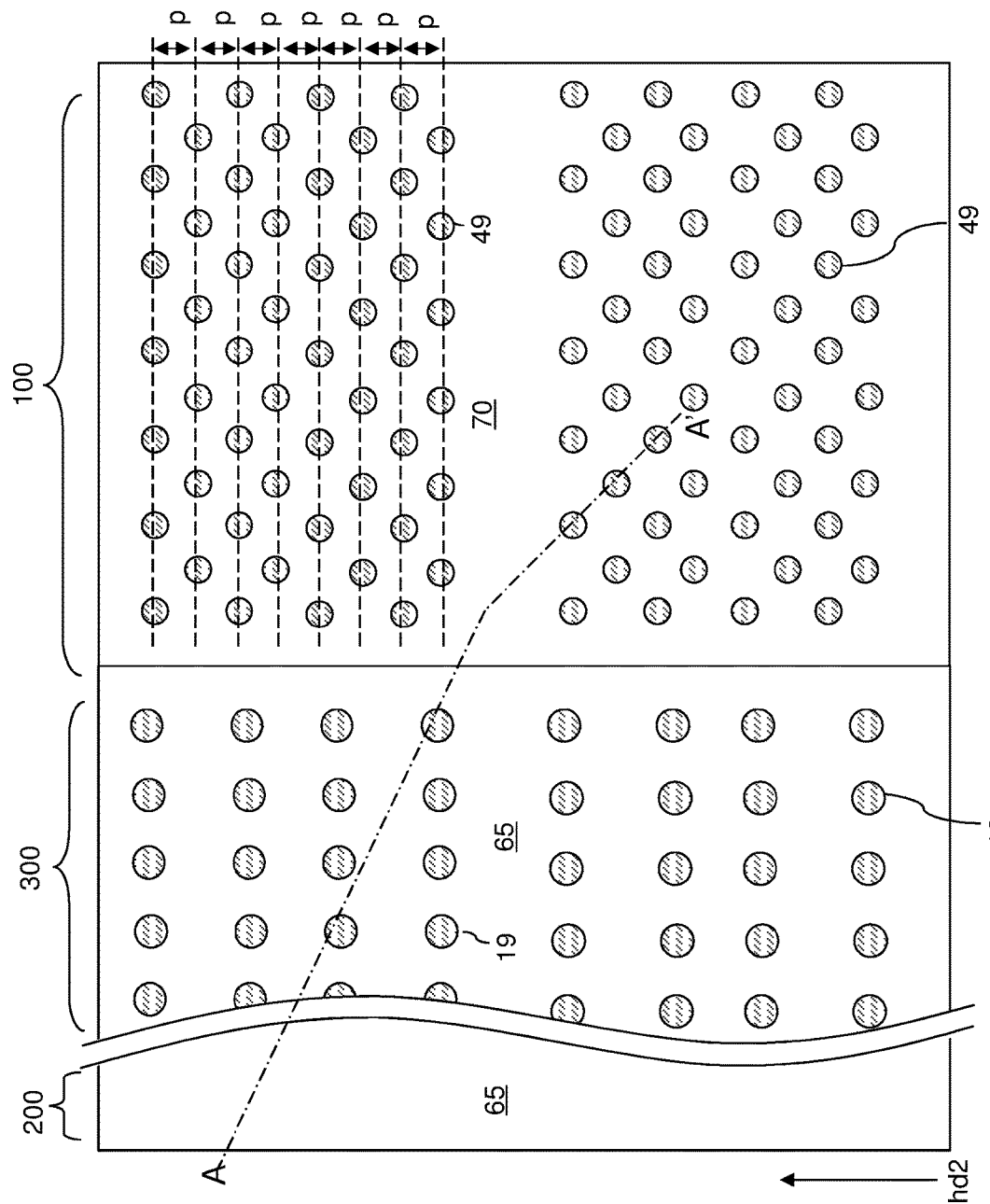
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

In one embodiment, an entire set of memory openings 49 between a pair of neighboring areas for subsequently forming backside trenches can be arranged in rows having a same inter-row pitch p throughout, as shown in FIG. 4B. In one embodiment, the rows of memory openings 49 can laterally extend along a first horizontal direction hd1, and can be laterally spaced among one another along a second horizontal direction hd2 that is perpendicular to the first horizontal direction hd1.

FIGS. 5A-5L illustrate structural changes during formation of a memory stack structure, an optional dielectric core, and a drain region in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, sidewalls of the sacrificial material layers 42 can be laterally recessed around each of the memory openings 49 and each of the support openings 19 by an isotropic etch process that etches the material of the sacrificial material layers 42 selective to the material of the insulating layers 32. The isotropic etch process can be selective to the material of the pedestal channel portions 11. For example, if the sacrificial material layers 42 include silicon nitride, the insulating layers 32 include silicon oxide, and the epitaxial channel portions 11 include silicon, the isotropic etch process can include a wet etch process employing hot phosphoric acid as an etchant. The lateral distance between the sidewalls of the sacrificial material layers 42 and a vertical plane including sidewalls of overlying and underlying insulating layers 32 defines a lateral recess distance, which can be in a range from 20 nm to 120 nm, such as from 30 nm to 90 nm, although lesser and greater lateral recess distances can also be employed. The volumes from which the sacrificial material layers 42 are etched define annular recesses 149, i.e., recessed having a respective annular shape. As used herein, an "annular shape" refers to a shape that is homeomorphic to a torus. Recesses (not shown) having a non-annular shape may be formed around portions of some support openings 19 that straddle the alternating stack (32, 42) and the retro-stepped dielectric material portion 65.

Referring to FIG. 5D, a blocking dielectric layer 52L can be conformally deposited on the physically exposed surfaces of the memory openings 49 and the support openings 19, which include the physically exposed surfaces of the annular recesses 149. The blocking dielectric 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric 52 includes aluminum oxide. In one embodiment, the blocking dielectric 52 can include multiple dielectric metal oxide layers having different material compositions.

Alternatively or additionally, the blocking dielectric 52 can include a dielectric semiconductor compound such as silicon oxide, silicon oxynitride, silicon nitride, or a combination thereof. In one embodiment, the blocking dielectric 52 can include silicon oxide. In this case, the dielectric semiconductor compound of the blocking dielectric 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric 52 can be omitted, and a backside blocking dielectric layer can be formed after formation of backside recesses on surfaces of memory films to be subsequently formed.

Referring to FIG. 5E, a floating gate material layer 54L can be formed in remaining volumes of the annular recesses 149 and at peripheral portions of the memory openings 49 and support openings 19. The floating gate material layer 54L includes a conductive material that can store electrical charges therein. The floating gate material layer 54L can include a metallic material (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or a semiconductor material (e.g., polycrystalline or amorphous semiconductor material including at least one elemental semiconductor element, such as polysilicon or amorphous silicon, or at least one compound semiconductor material). The floating gate material layer 54L can be formed, for example, by chemical vapor deposition (CVD), atomic layer deposition (ALD), physical vapor deposition (PVD), or any suitable deposition technique for storing electrical charges therein. The thickness of the floating gate material layer 54L is selected such that the entire volume of each annular recess 149 is filled with the combination of the blocking dielectric layer 52L and the floating gate material layer 54L. In one embodiment, the thickness of the floating gate material layer 54L can be in a range from 10 nm to 100 nm, although lesser and greater thicknesses can also be employed.

Referring to FIG. 5F, an anisotropic etch can be performed to remove portions of the floating gate material layer 54L from outside the volumes of the lateral recesses 149. The anisotropic etch may be selective to the material of the blocking dielectric layer 52L. For example, if the floating gate material layer 54L includes polysilicon, a reactive ion etch process employing an etchant gas such as $CF_4$, $Cl_2$, and/or $SF_6$ can be employed to remove the portions of the floating gate material layer 54L from outside the volumes of the annular recesses 149. Each remaining portion of the floating gate material layer 54L around the memory openings 49 and the support openings constitutes a floating gate electrode 54. Each floating gate electrode 54 located around any one of the memory openings 49 can have an annular shape, i.e., a toroidal shape. In one embodiment, each floating gate electrode 54 located around any one of the memory openings 49 can have an inner cylindrical sidewall, an outer cylindrical sidewall, and an upper annular surface and a lower annular surface connecting the inner cylindrical sidewall and the outer cylindrical sidewall. Some floating gate electrodes 54 formed around the support openings 19 can have an annular shape. Some other floating gate electrodes 54 formed in non-annular recesses around regions of the support openings 19 that straddle the interface between the alternating stack (32, 42) and the retro-stepped dielectric material portion 65 may have non-annular shapes.

Subsequently, physically exposed portions of the blocking dielectric layer 52L can be removed from above the insulating cap layer 70 and from inside the memory openings 49 and the support openings 19. Removal of the physically exposed portions of the blocking dielectric layer 52L can be effected by an isotropic etch process such as a wet etch process. For example, if the blocking dielectric layer 52L includes amorphous aluminum oxide, the physically exposed portions of the blocking dielectric layer 52L can be etched by a wet etch process employing $H_3PO_4$, $NH_4OH$, tetramethylammonium hydroxide (TMAH), or a mixture thereof. If the blocking dielectric layer 52L includes silicon oxide, a wet etch process employing hydrofluoric acid can be employed. Each remaining portion of the blocking dielectric layer 52L constitutes a blocking dielectric 52. Each blocking dielectric 52 located around any one of the memory openings 49 can have a toroidal clam shape, and can include a cylindrical vertical portion, an annular upper portion of which an outer periphery is adjoined to an upper end of the cylindrical vertical portion, and an annular lower portion of which the outer periphery is adjoined to a lower end of the cylindrical vertical portion. Some blocking dielectrics 52 formed around the support openings 19 can have a toroidal clam shape. Some other blocking dielectrics 52 formed in non-annular recesses around regions of the support openings 19 that straddle the interface between the alternating stack (32, 42) and the retro-stepped dielectric material portion 65 may have shapes that are not toroidal clam shapes.

A combination of a blocking dielectric 52 and a floating gate electrode 54 can be formed in each of the annular recesses 149 around the memory openings 49. In one embodiment, the inner sidewalls of the floating gate electrodes 54 around a memory opening 49 can be vertically coincident with sidewalls of the insulating layers 32 around the memory opening 49. As used herein, a first surface and a second surface are vertically coincident with each other if the second surface overlies or underlies the first surface and if there exists a vertical plane including the first surface and the second surface. Inner sidewalls of the blocking dielectrics 52 around a memory opening 49 may be vertically coincident with the inner sidewalls of the floating gate electrodes 54 around the memory opening 49.

Referring to FIG. 5G, a tunneling dielectric layer 56 and an optional first semiconductor channel layer 601 can be sequentially deposited in each of the memory openings 49 and the support openings 19. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5H, the optional first semiconductor channel layer 601 and the tunneling dielectric layer 56 are sequentially anisotropically etched employing at least one anisotropic etch process. The portions of the first semiconductor channel layer 601 and the tunneling dielectric layer 56 located above the top surface of the insulating cap layer 70 can be removed by the at least one anisotropic etch process. Further, the horizontal portions of the first semiconductor channel layer 60 and the tunneling dielectric layer 56 at a bottom of each memory cavity 49' can be removed to form openings in remaining portions thereof. Each of the first semiconductor channel layer 601 and the tunneling dielectric layer 56 can be etched by a respective anisotropic etch process employing a respective etch chemistry, which may, or may not, be the same for the various material layers.

Each remaining portion of the first semiconductor channel layer 601 can have a tubular configuration. A surface of the pedestal channel portion 11 (or a surface of the semiconductor material layer 10 in case the pedestal channel portions 11 are not employed) can be physically exposed underneath the opening through the first semiconductor channel layer 601 and the tunneling dielectric layer 56. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over a vertical stack of floating gate electrodes 54, and contacts inner sidewalls of each floating gate electrode 54 within the vertical stack of floating gate electrodes 54. A set of blocking dielectrics 52, floating gate electrodes 54, and a tunneling dielectric layer 56 around each memory opening 49 constitutes a memory film 50. The memory film 50 includes a plurality of charge storage regions (comprising the floating gate electrodes 54) that are insulated from surrounding materials by the blocking dielectrics 52 and the tunneling dielectric layer 56. In one embodiment, the first semiconductor channel layer 601 and the tunneling dielectric layer 56 can have vertically coincident sidewalls around an opening overlying an epitaxial channel portion 11.

Referring to FIG. 5I, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5J, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5K, the horizontal portion of the dielectric core layer 62L can be removed, for example, by a recess etch from above the top surface of the insulating cap layer 70. The remaining portions of the dielectric core layer 62L can be further recessed below the horizontal plane including the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a recess etch process. Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a floating gate electrode 54, and laterally surrounds a portion of the vertical semiconductor channel 60.

Referring to FIG. 5L, drain regions 63 can be formed within each cavity overlying the dielectric cores 62 by depositing a doped semiconductor material therein. Excess portions of the deposited doped semiconductor material can be removed from above the horizontal plane including the top surface of the insulating cap layer 70, for example, by a recess etch. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel 60, a tunneling dielectric layer, a plurality of memory elements as embodied as floating gate electrodes 54, and blocking dielectrics 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Figure 6A:
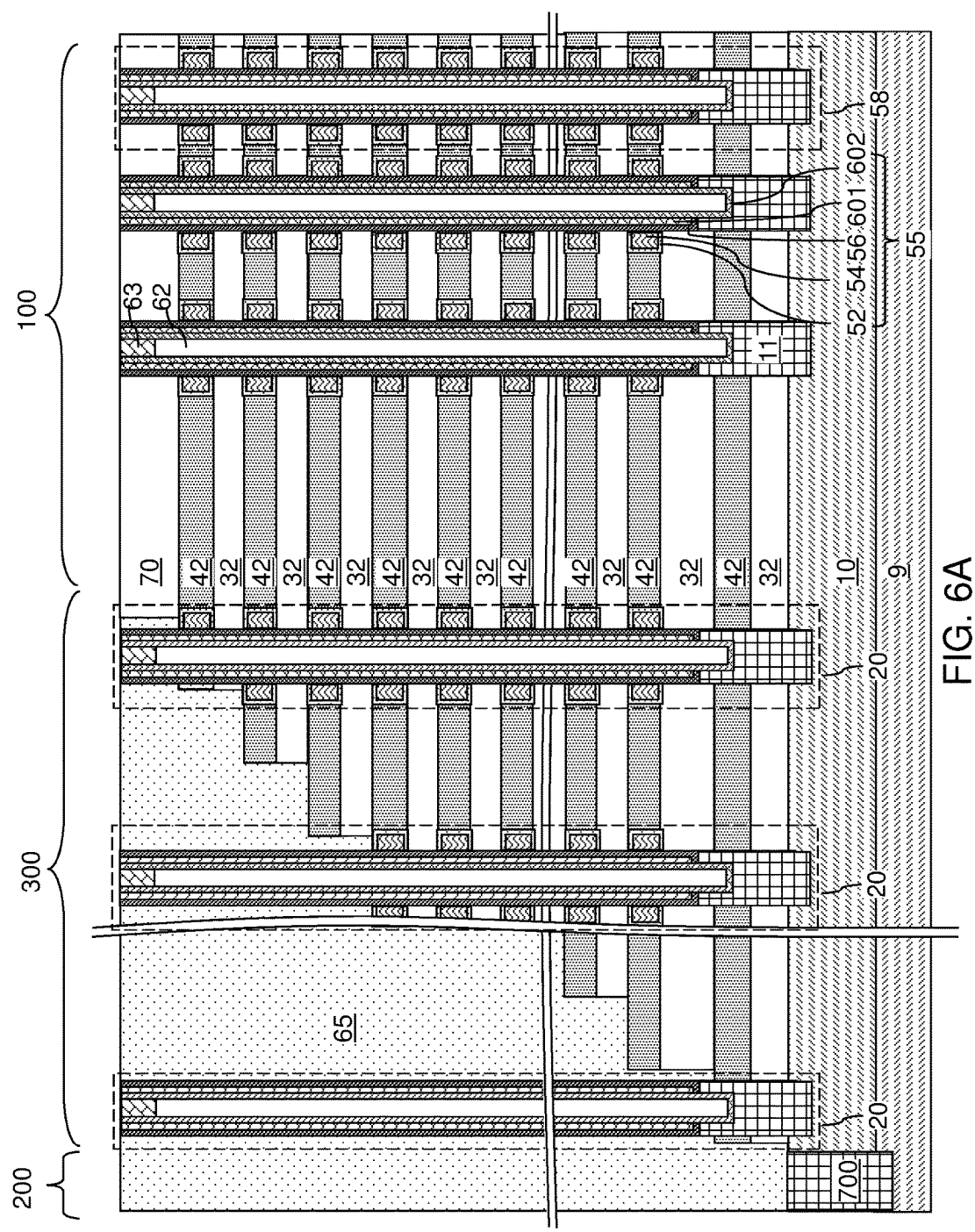
FIG. 6A is a schematic vertical cross-sectional view of the exemplary structure after formation of memory stack structures and support pillar structures according to an embodiment of the present disclosure.
Figure 6B:
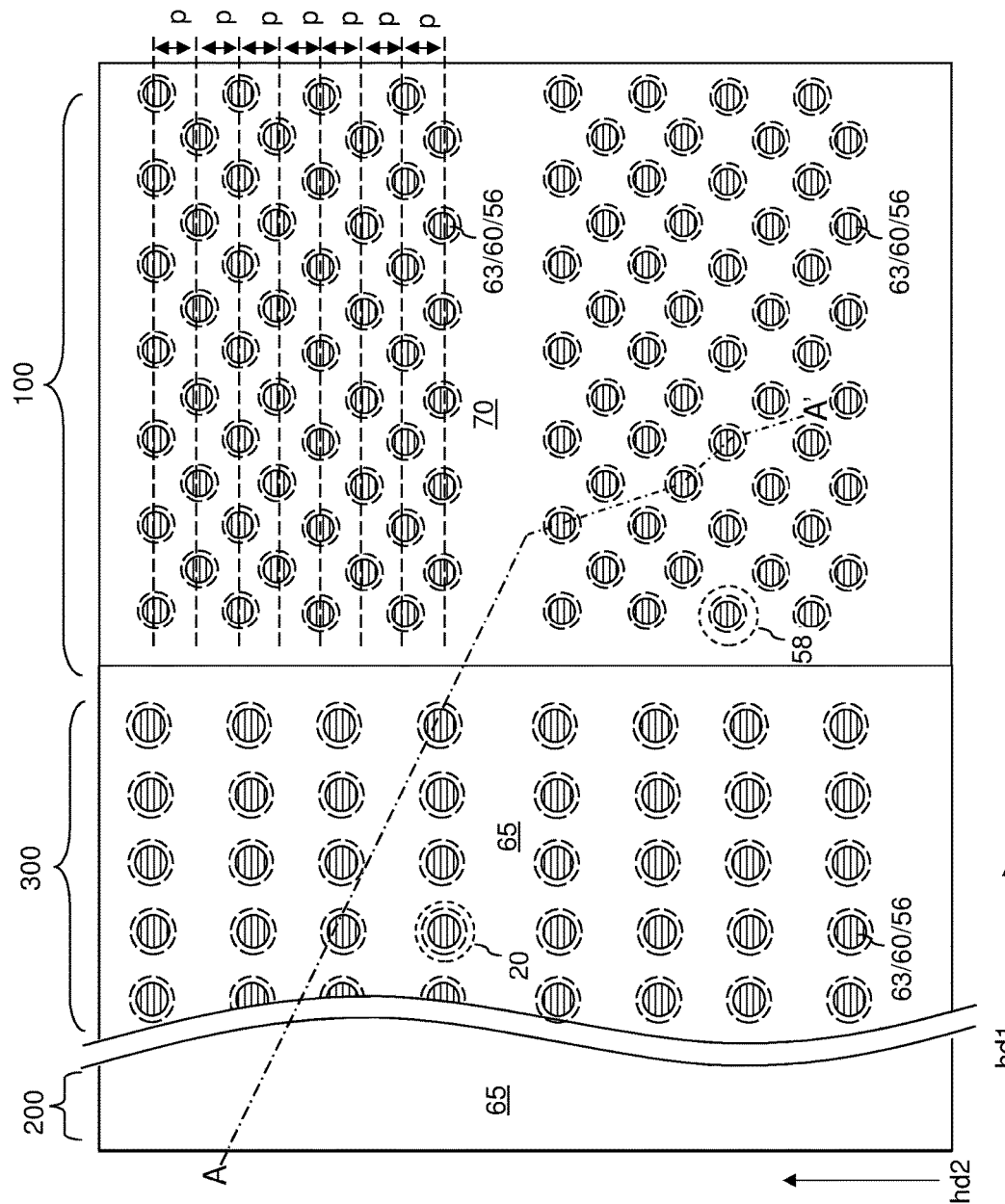
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 can be formed through the retro-stepped dielectric material portion 65 in the terrace region.

Each group of memory stack structures 55 located between a neighboring pair of areas for forming backside trenches can be arranged in rows having a uniform inter-row pitch p, as shown in FIG. 6B. In one embodiment, each group of memory stack structures 55 located between a neighboring pair of areas for forming backside trenches can be arranged as a two-dimensional periodic array such as a hexagonal array.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions (comprising the floating gate electrodes 54) laterally surrounding the tunneling dielectric layer 56 and blocking dielectrics 52. While the present disclosure is described employing the illustrated configuration for the memory stack structures, the methods of the present disclosure can be applied to alternative memory stack structures including different layer stacks or structures for the memory film 50 and/or for the vertical semiconductor channel 60.

Figure 7A:
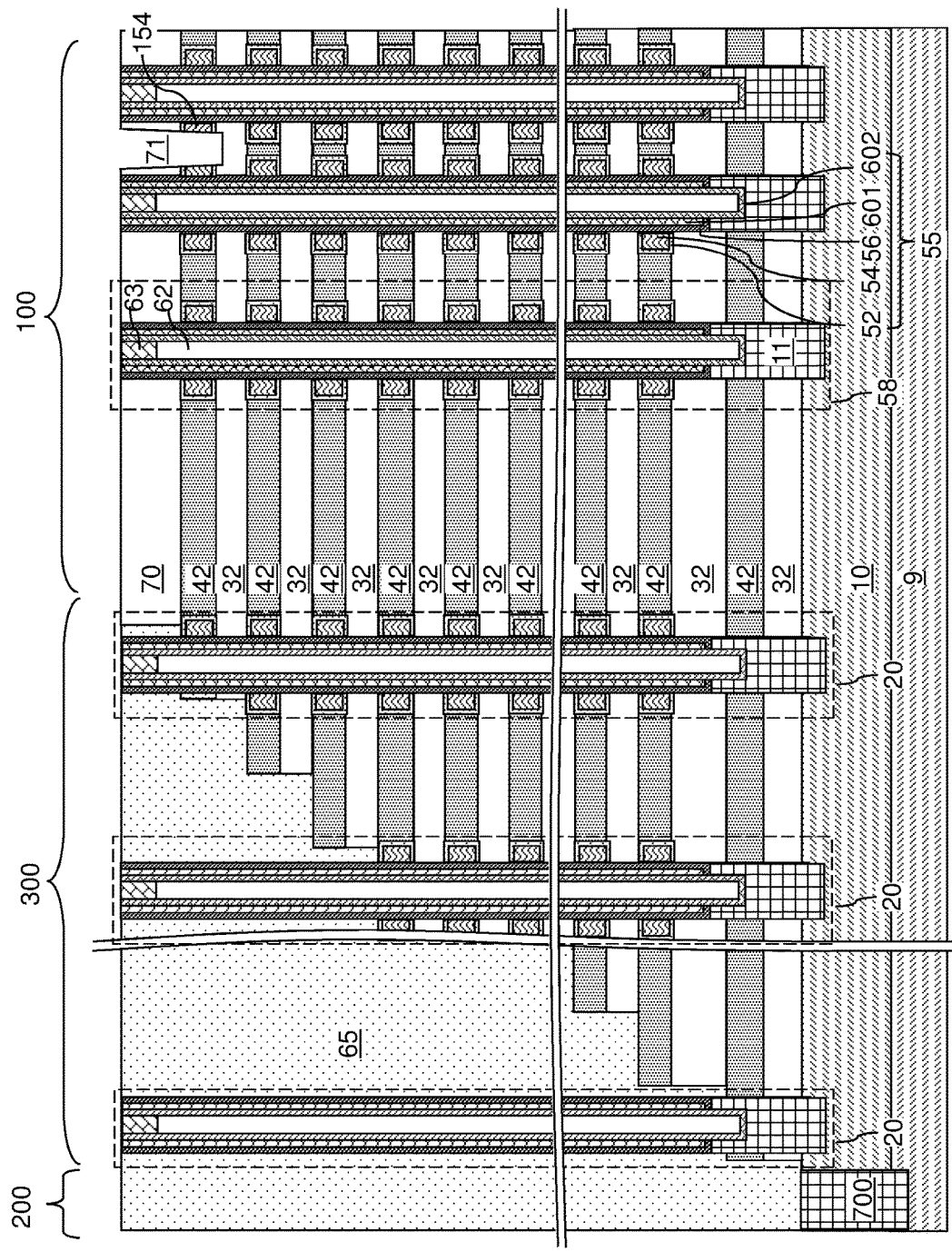
FIG. 7A is a schematic vertical cross-sectional view of the exemplary structure after formation of shallow trenches through at least one drain select electrode level according to an embodiment of the present disclosure.
Figure 7B:
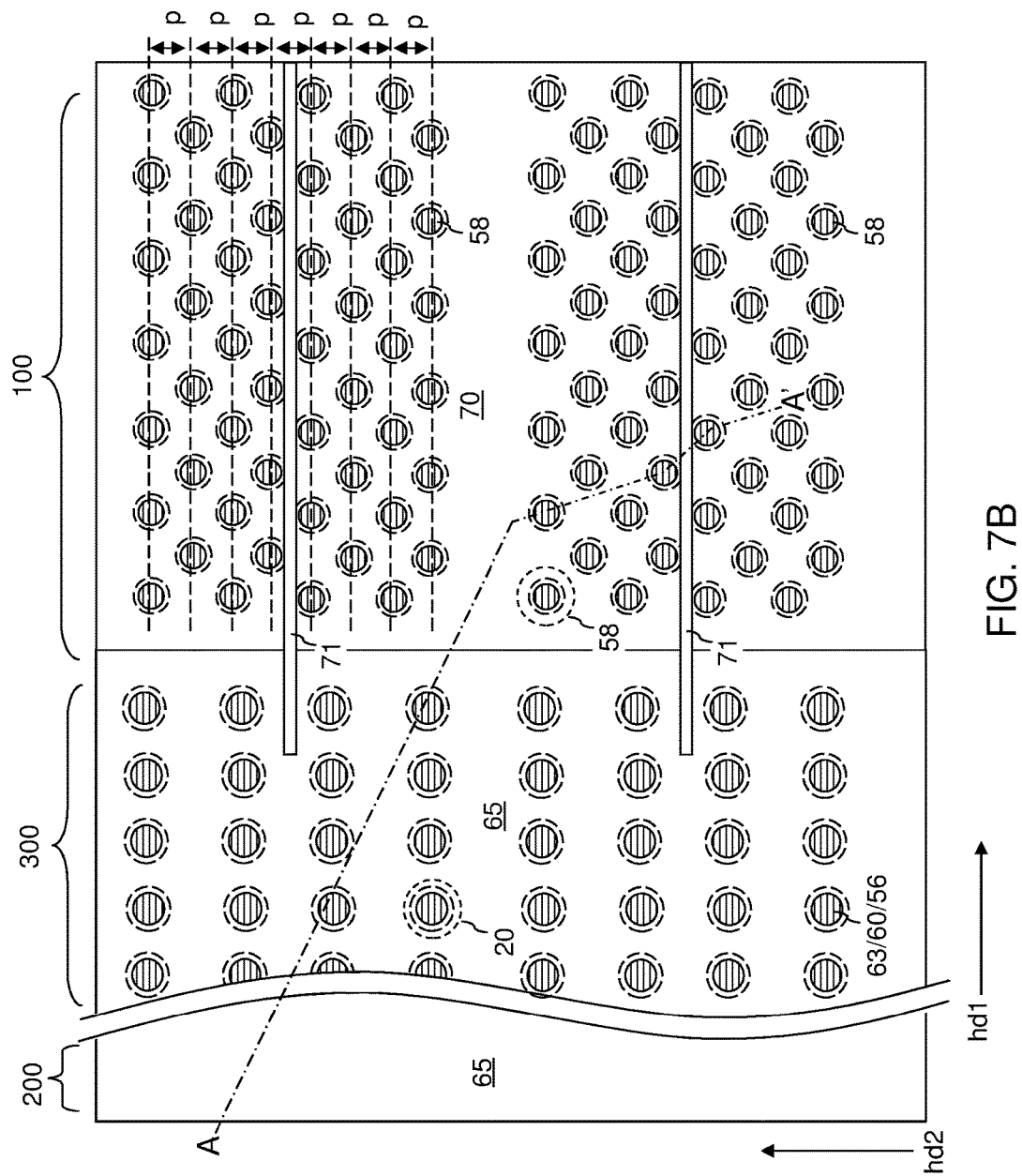
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a photoresist layer (not shown) can be applied over the exemplary structure, and can be lithographically patterned to form elongated openings therein. The elongated openings can laterally extend along the direction of the rows along which the memory stack structures laterally extend. In one embodiment, the elongated openings can have a uniform with throughout. In one embodiment, the elongated openings can be rectangular openings.

For example, as shown in FIG. 7B, each row of memory stack structures 55 can laterally extend along the first horizontal direction hd1 (e.g., the word line direction), and the elongated openings can extend along the first horizontal direction hd1. The elongated openings in the photoresist layer can be formed in a respective area between a neighboring pair of rows of memory stack structures 55 within clusters of memory stack structures 55 that are laterally spaced among one another along the second horizontal direction hd2 (e.g., the bit line direction). Each cluster of memory stack structures 55 includes a plurality of rows of memory stack structures 55 having a uniform intra-row pitch p among the rows. The width of the elongated openings can be selected such that the lengthwise edges of the elongated openings do not overlie areas of the memory openings 49 in which the tunneling dielectric layers 56 and the vertical semiconductor channels 60 are present. Further, the areas of the elongated openings can be selected to overlap with areas of a subset of the floating gate electrodes 54.

The pattern in the elongated openings of the photoresist layer can be subsequently transferred through at least one spacer material layer (which may be at least one sacrificial material layer 42 if the spacer material layers are formed as sacrificial material layers, or may be at least one electrically conducive layer if the spacer material layers are formed as electrically conducive layers) by an anisotropic etch process. For example, the pattern of the elongated openings in the photoresist layer can be transferred through the insulating cap layer 70, at least one sacrificial material layer 42 including the topmost sacrificial material layer, and any intervening insulating layers 32 among a plurality of sacrificial material layers 42 in case the at least one sacrificial material layer 42 is the plurality of sacrificial material layers 42.

Shallow trenches 71 can be formed in each volume from which materials of the insulating cap layer 70 and the alternating stack (32, 42) are removed by the anisotropic etch process. Shallow trenches 71 extend through the sacrificial material layers 42 that are located in the drain select levels, but do not extend through the sacrificial material layers 42 that are located in the word line and source select levels of the alternating stack (32, 42). Portions of floating gate electrodes 54 located at each level of the at least one etched sacrificial material layer 42 (including the level of the topmost spacer material layer) can be removed by the anisotropic etch process. Thus, the shallow trenches 71 are formed as cavities by the anisotropic etch process. Each of the shallow trenches 71 can have a pair of lengthwise sidewalls that extend along the lengthwise direction. For example, the pair of lengthwise sidewalls can laterally extend along the first horizontal direction hd1. The pair of lengthwise sidewalls can be contained within a pair of two-dimensional planes.

Each shallow trench 71 divides at least one sacrificial material layer 42 including a topmost sacrificial material layer into discrete portions that are laterally spaced among one another without direct contact thereamongst (e.g., the shallow trenches 71 divide the sacrificial material layers 42 that are located in the drain select levels, but do not divide the sacrificial material layers 42 that are located in the word line and source select levels of the alternating stack (32, 42)). In one embodiment, a shallow trench 71 can cut through floating gate electrodes 54 located in the pair of rows of the memory stack structures 55 through which the shallow trench 71 laterally extends. The floating gate electrodes 54 that are cut through by the shallow trench 71 are located at levels of the at least one sacrificial material layer 42 including the topmost sacrificial material layer. Thus, a subset of the floating gate electrodes 54 located at each level of the at least one sacrificial material layer 42 divided by the shallow trenches 71 is physically exposed around each shallow trench 71. Physically exposed sidewalls of the floating gate electrodes 54 can include planar surfaces, i.e., surfaces within a two-dimensional surface. The shallow trenches 71 can laterally extend into an upper portion of the retro-stepped dielectric material portion 65. The photoresist layer can be subsequently removed, for example, by ashing.

Figure 8:
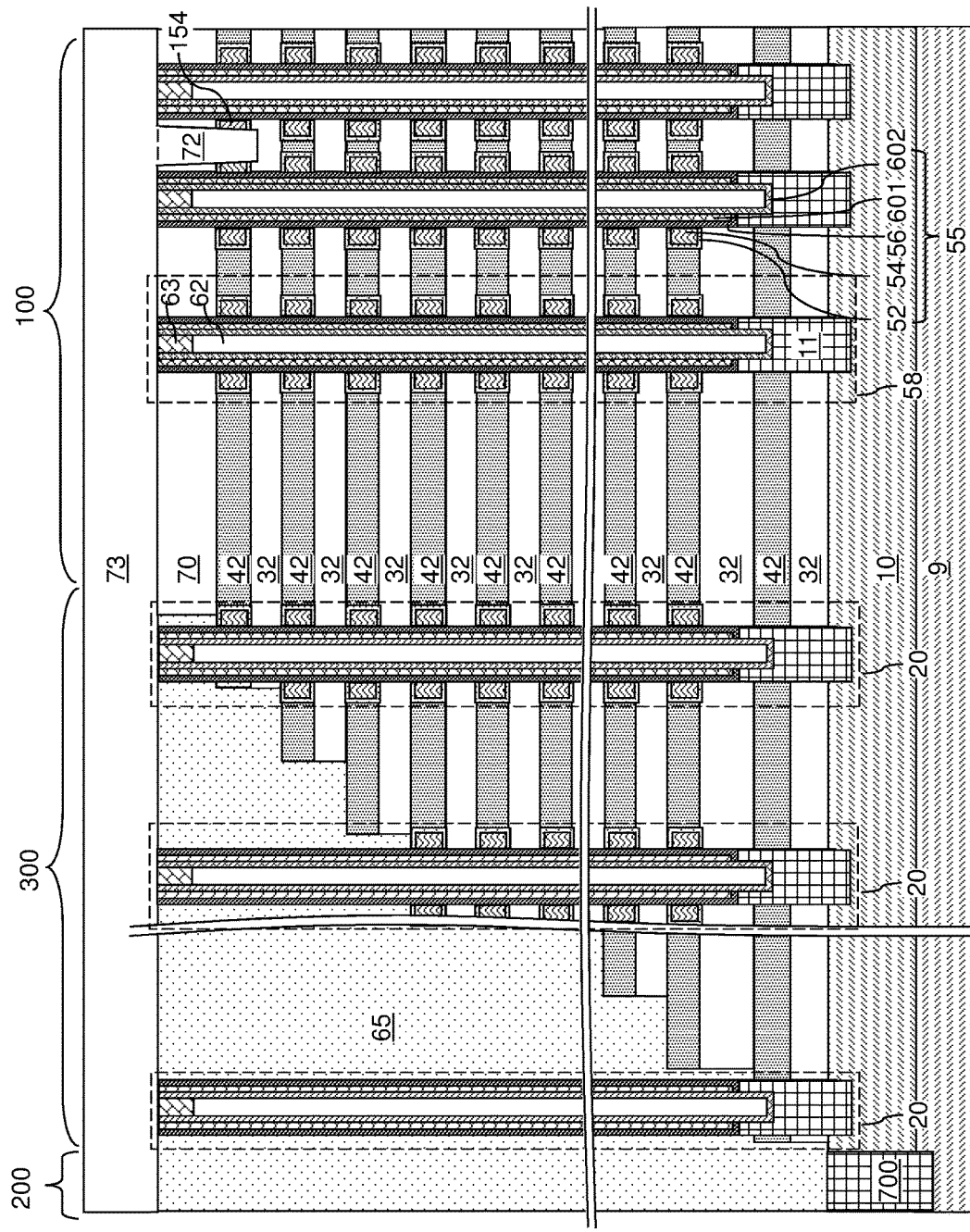
FIG. 8 is a schematic vertical cross-sectional view of the exemplary structure after formation of dielectric isolation structures in the shallow trenches according to an embodiment of the present disclosure.

Referring to FIG. 8, a dielectric material is deposited in the shallow trenches 71 and over the top surfaces of the insulating cap layer 70. The deposited dielectric material forms a dielectric material layer, which is herein referred to as a contact level dielectric layer 73. The dielectric material of the contact level dielectric layer 73 is different from the material of the sacrificial material layers 42. For example, if the sacrificial material layers 42 include silicon nitride and the insulating layers 32 include a silicon oxide material, the contact level dielectric layer 73 can include a silicon oxide material such as undoped silicate glass or a doped silicate glass. The horizontal portion of the contact level dielectric layer 73 overlying the insulating cap layer 70 can have a thickness in a range from 50 nm to 500 nm, although lesser and greater thicknesses can also be employed.

The downward-protruding portions of the contact level dielectric layer 73 that fill the shallow trenches 71 is herein referred to as dielectric isolation structures 72. The dielectric isolation structures 72 laterally extend into an upper portion of the retro-stepped dielectric material portion 65. Each of the dielectric isolation structures 72 divides at least one spacer material layer including the topmost spacer material layer into discrete portions, which can be at least one sacrificial material layers 42 or at least one electrically conductive layers. Thus, the dielectric isolation structures 72 divide the spacer layers (e.g., the sacrificial material layers 42) that are located in the drain select levels, but do not divide the spacer layers (e.g., the sacrificial material layers 42) that are located in the word line and source select levels of the alternating stack (32, 42)

In one embodiment, a subset of the floating gate electrodes 54 located at each level of the at least one spacer material layer, including the level of the topmost spacer material layer, directly contacts a respective sidewall of the dielectric isolation structures 72.

In one embodiment, each lengthwise sidewall of the dielectric isolation structure 72 can directly contact planar sidewalls of a subset of the floating gate electrodes 54. Floating gate electrodes 54 that contact the dielectric isolation structures 72 can have a respective convex sidewall and a respective planar sidewall that is adjoined to vertical edges of the respective outer convex sidewall. Each planar sidewall of the floating gate electrodes 54 can contact a respective lengthwise sidewall of the dielectric isolation structures 72, and each convex sidewall of the floating gate electrodes 54 can contact a respective concave sidewall of the blocking dielectrics 52.

Figure 9A:
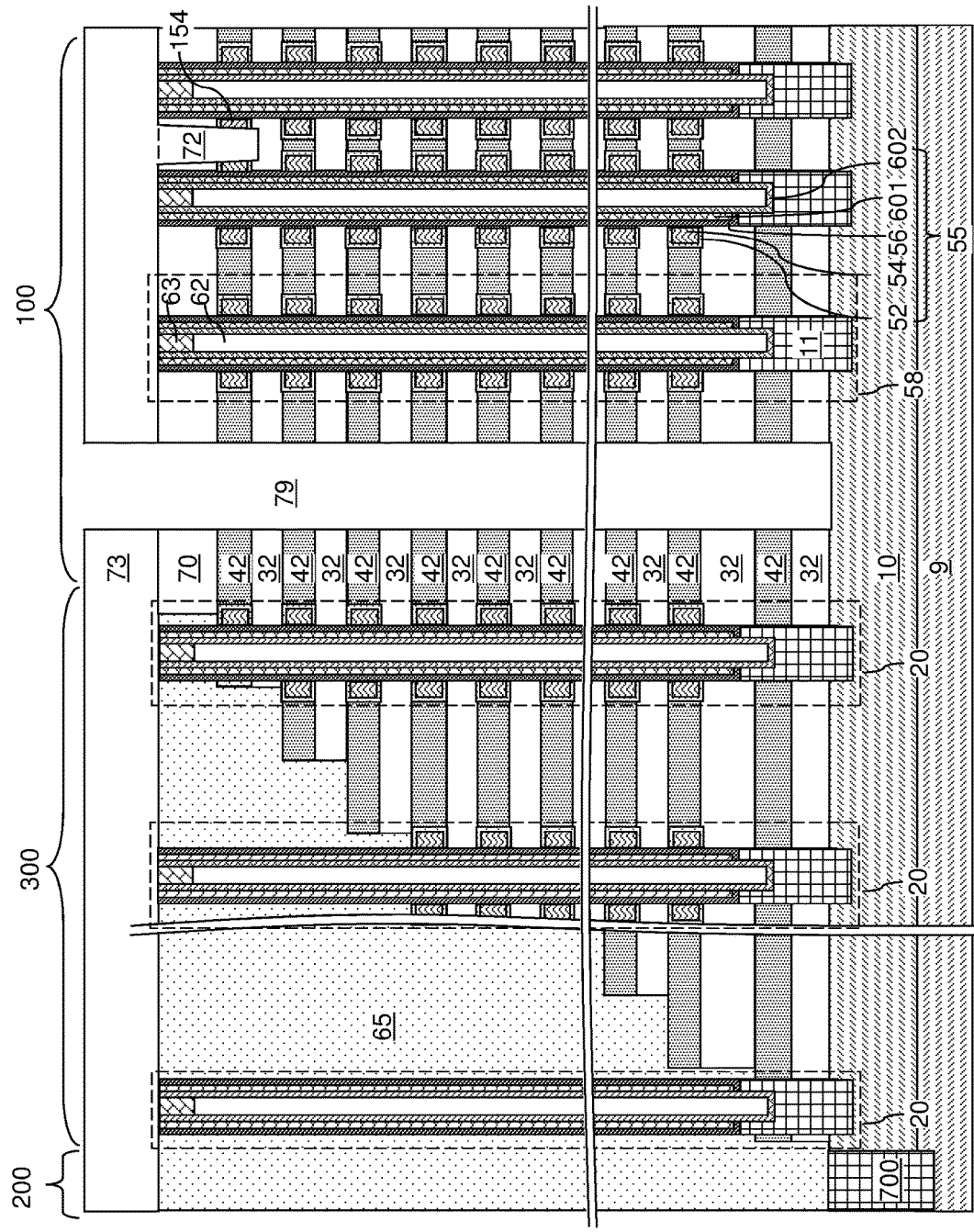
FIG. 9A is a schematic vertical cross-sectional view of the exemplary structure after formation of backside trenches according to an embodiment of the present disclosure.
Figure 9B:
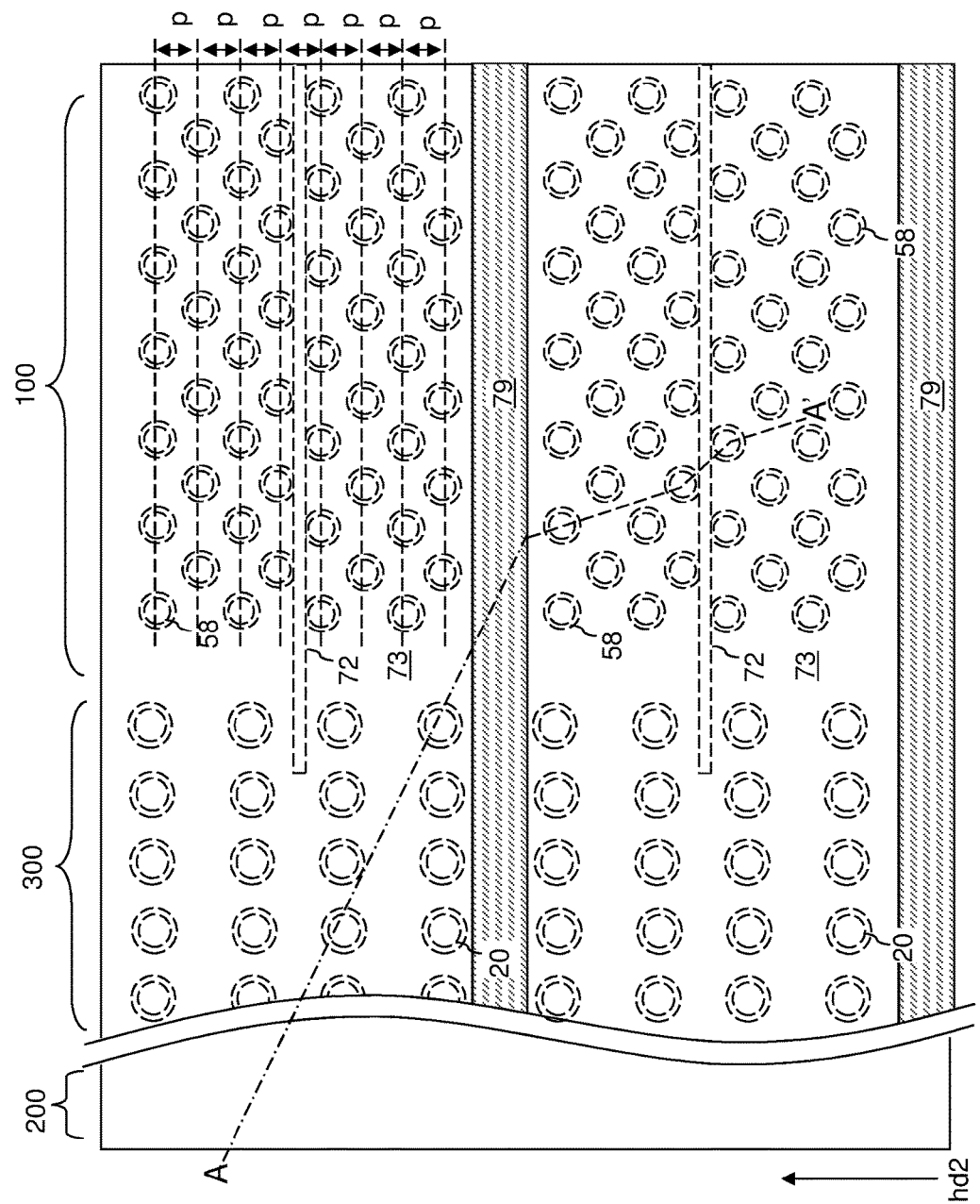
FIG. 9B is a partial see-through top-down view of the exemplary structure of FIG. 9A. The vertical plane A-A' is the plane of the schematic vertical cross-sectional view of FIG. 9A.

Referring to FIGS. 9A and 9B, a photoresist layer (not shown) can be applied over the contact level dielectric layer 73, and is lithographically patterned to form openings in areas between clusters of memory stack structures 55. The pattern of the openings can be located between neighboring clusters of memory stack structures 55. For example, the pattern of the openings can be located in areas in which neighboring rows of memory stack structures 55 are spaced from each other by a distance greater that the uniform inter-row pitch p within clusters of memory openings by a factor of at least 1.5, which can be, for example, in a range from 2 to 6. In one embodiment, the pattern of the openings in the photoresist layer can include rectangular openings having lengthwise edges that extend along the first horizontal direction. The openings in the photoresist layer can extend from the memory array region 100 to the contact region 300. The areas of the openings in the photoresist layer can be selected such that the areas of the openings do not overlap with the areas of the memory stack structures 55.

The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing. The backside trenches 79 are deeper than the shallow trenches 71. The backside trenches 79 extend through the sacrificial material layers 42 that are located in the drain select levels, in the word line levels and source select levels of the alternating stack (32, 42). The backside trenches 79 can be located in regions where spacing between adjacent rows of memory stack structures 55 is greater than the inter-row pitch p, while the shallow trenches 71 filled with the dielectric isolation structures 72 can be located in between adjacent rows of memory stack structures 55 having the inter-row pitch p.

The backside trenches 79 can laterally extend along the first horizontal direction hd1, and can be formed between neighboring pairs of dielectric isolation structures 72. At least one dielectric isolation structure 72 can be present between each neighboring pair of backside trenches 79. The backside trenches 79 can include, for example, a first backside trench and a second backside trench extending through the alternating stack (32, 42) and laterally spaced from each other by a portion of the alternating stack (32, 42), which is herein referred to as a first alternating stack (32, 42). The first alternating stack includes remaining portions of the insulating layers 32 and the spacer material layers (such as the spacer material layers 42), and is formed between the first backside trench 79 and the second backside trench 79. At least one dielectric isolation structure 72 is embedded within the first alternating stack.

Figure 10:
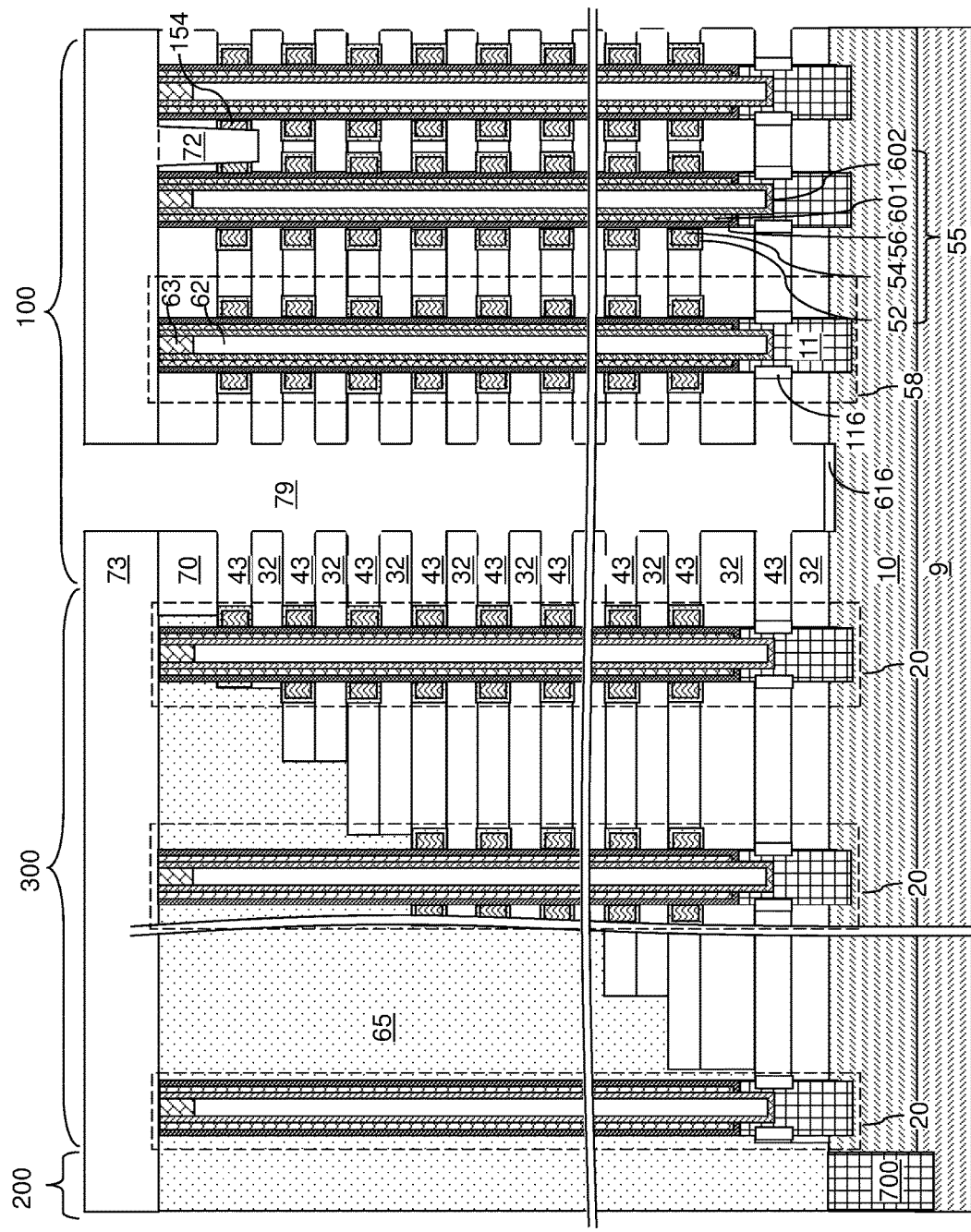
FIG. 10 is a schematic vertical cross-sectional view of the exemplary structure after formation of backside recesses according to an embodiment of the present disclosure.
Figure 11A:
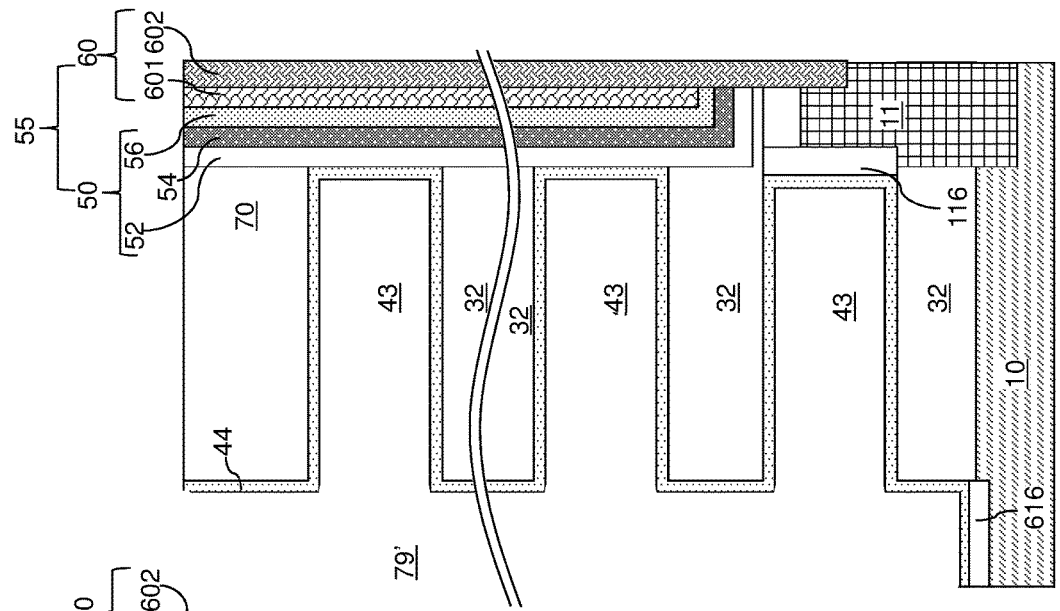

Referring to FIGS. 10 and 11A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50 (i.e., the blocking dielectrics 52). In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Each backside recess 43 located below the levels of the dielectric isolation structures 72 laterally extend between a neighboring pair of backside trenches 79 along the second horizontal direction hd2. Each backside recess 43 located at the level(s) of the dielectric isolation structures 72 is laterally bounded by one of the dielectric isolation structures 72, and therefore, laterally extends along the second horizontal direction hd2 by a distance that is less than the lateral separation distance between a neighboring pair of backside trenches 79 along the second horizontal direction hd2. Therefore, backside recesses located at levels of the dielectric isolation structures 72 (e.g., in the drain select levels) has a lesser lateral extent along the second horizontal direction hd2 (which is the bit line direction that is perpendicular to the lengthwise direction (e.g., word line direction) of the backside trenches 79) than backside recesses 79 located in the word line and source select levels the levels of the dielectric isolation structures 72. If a dielectric isolation structure 72 is equidistant from a neighboring pair of backside trenches 79, the lateral extent of the backside recesses 43 laterally bounded by the dielectric isolation structure 72 can be less than one half of the lateral spacing between the two backside trenches 79 within the pair of backside trenches 79.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 11B:
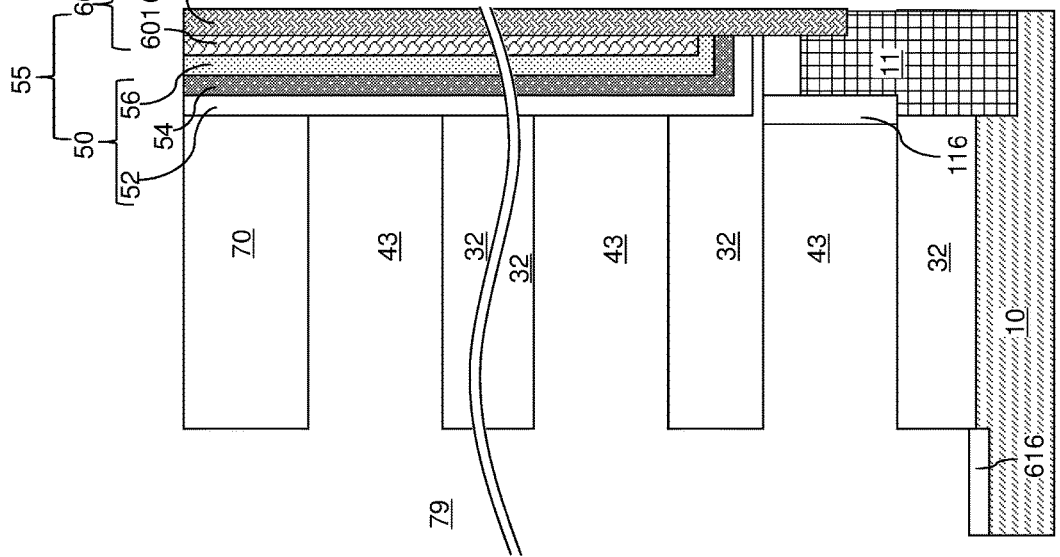

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric 52 is present within each memory opening, the backside blocking dielectric layer 44 is optional. In case the blocking dielectric 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 11C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 12:
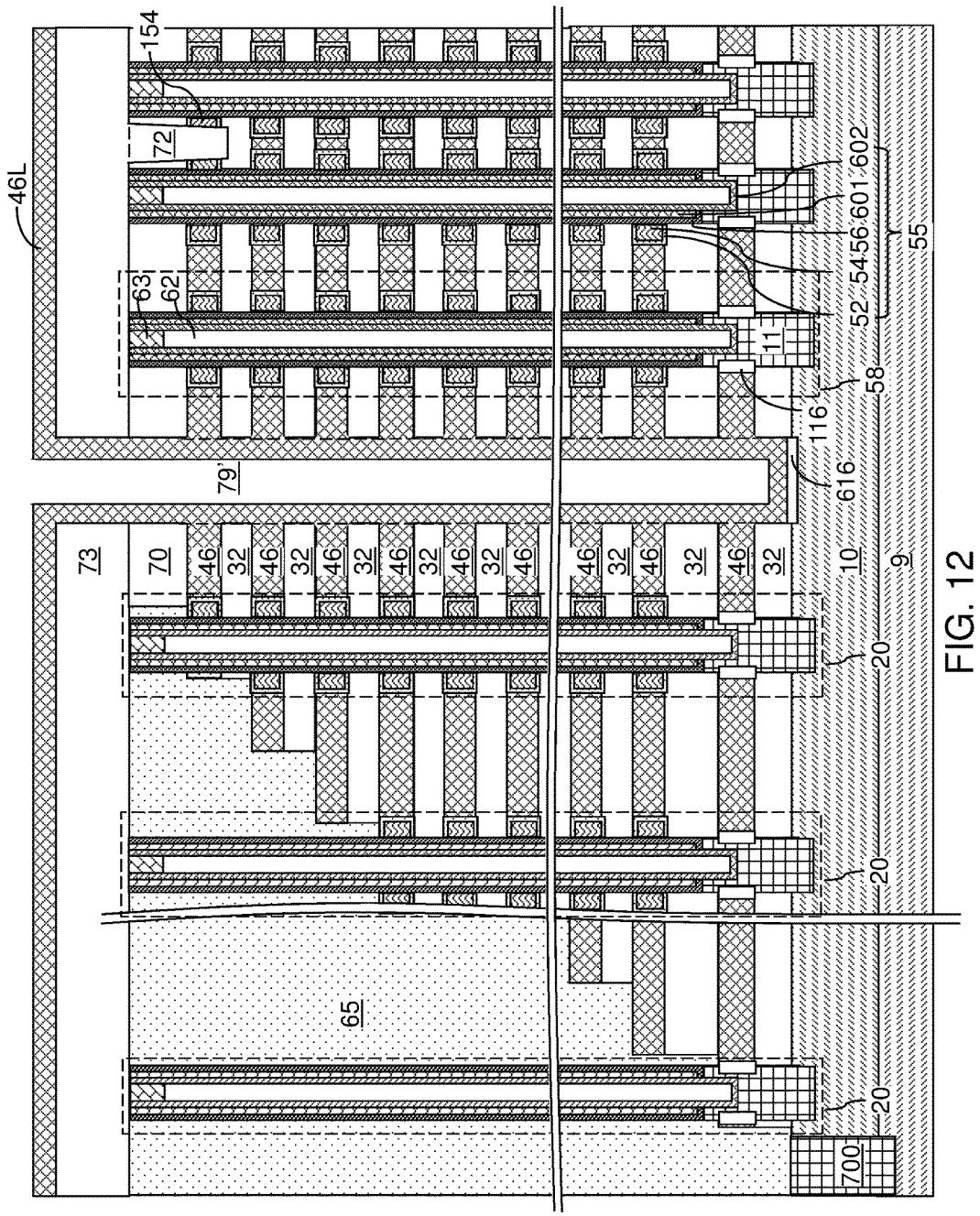
FIG. 12 is a schematic vertical cross-sectional view of the exemplary structure at the processing step of FIG. 11D.

Referring to FIGS. 11D and 12, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13:
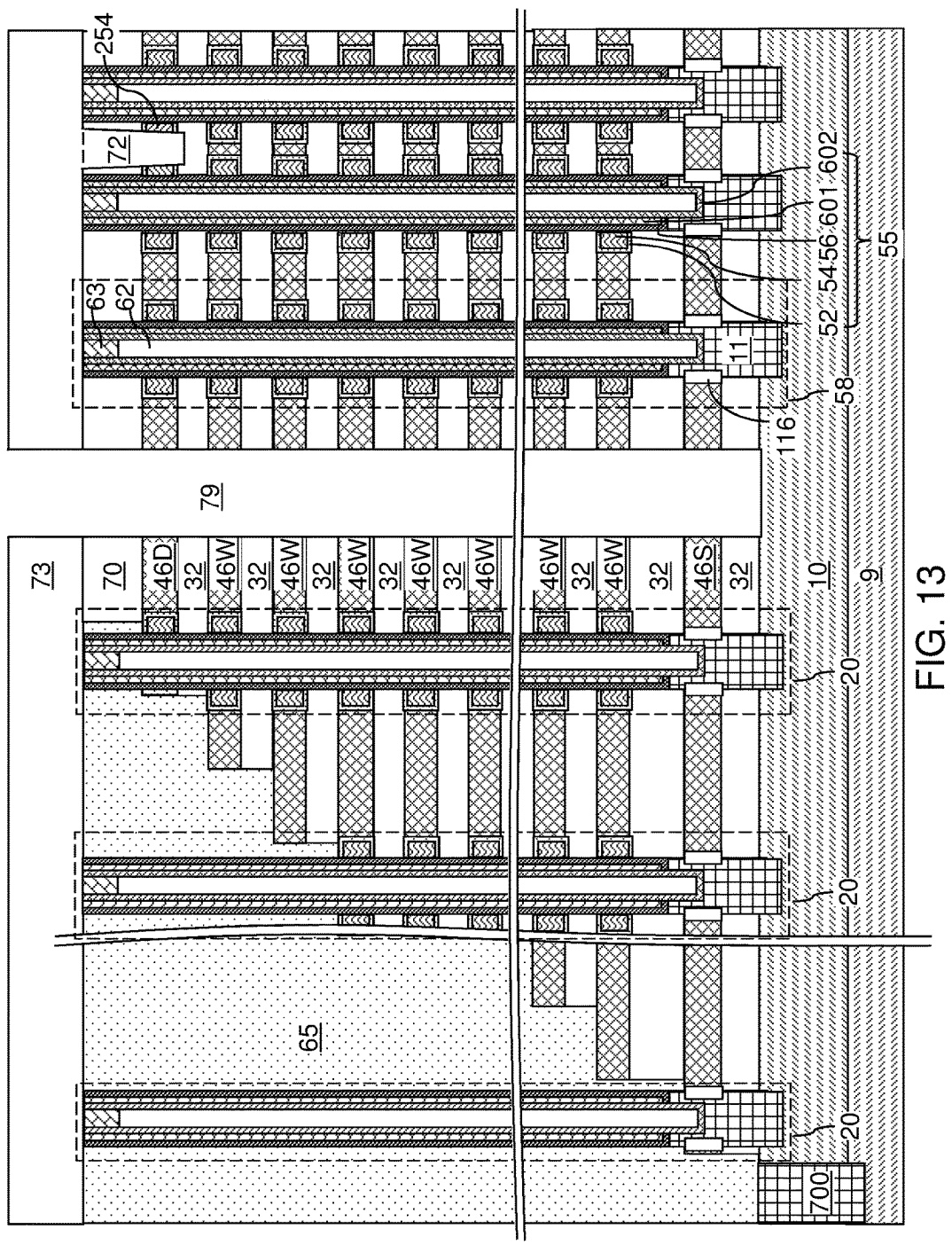
FIG. 13 is a schematic vertical cross-sectional view of the exemplary structure after removal of a deposited conductive material from within the backside trench according to an embodiment of the present disclosure.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

The electrically conductive layers 46 include one or more drain select gate electrodes 46D, one or more source select gate electrodes 46S and word lines 46W located between the source and drain select gate electrodes (46S, 46D). The electrically conductive layers 46 that are formed at each level of the dielectric isolation structures 72, i.e., at each level at which the dielectric isolation structures 72 are present, can be employed to select a group of memory stack structures 55 (e.g., NAND strings) to be activated for programming or reading by applying a bias voltage to vertical semiconductor channels 60 at locations through drain regions 63. In this case, the electrically conductive layers 46D that are formed at each level of the dielectric isolation structures 72 are referred to as drain select gate electrodes. The drain select gate electrodes formed at the same level and between a neighboring pair of backside trenches 79 can be electrically isolated from each other by a dielectric isolation structure 72. At least two discrete electrically isolated drain select gate electrodes 46D are provided between a pair of adjacent backside trenches 79 at each level of the dielectric isolation structures 72 including the level of the topmost electrically conductive layers. Each of the at least two discrete electrically isolated drain select gate electrodes located at the same level between the first backside trench and the second backside trench (i.e., between a neighboring pair of backside trenches 79) has a lateral extent that is less than one half of a lateral distance between the first backside trench and the second backside trench.

The electrically conductive layers 46W located below the drain select levels, such as below the bottom of the dielectric isolation structures 72, can function as a combination of a plurality of control gate electrodes located at a same level and a word line electrically interconnecting, i.e., electrically shorting, the plurality of control gate electrodes located at the same level. The plurality of word lines/control gate electrodes 46W are the control gate electrodes for the vertical memory devices including the memory stack structures 55. In other words, each electrically conductive layer 46W can be a word line that functions as a common control gate electrode for the plurality of vertical memory devices (e.g., NAND strings). One or more electrically conductive layers 46S located below the word lines 46W function as source select gate electrodes of the source select transistors of the NAND strings.

An alternating stack of insulating layers 32 and electrically conductive layers 46 is formed between each neighboring pair of backside trenches 79. For example, a first alternating stack (32, 46) of insulating layers 32 and electrically conductive layers 46 can be formed between a neighboring pair of backside trenches 79 that include a first backside trench and a second backside trench. Multiple alternating stacks (32, 46) of respective insulating layers 32 and respective electrically conductive layers can be laterally spaced among one another by the backside trenches 79. A subset of the electrically conductive layers 46 (e.g., the word lines 46W and the source select gate electrodes 46S) within the first alternating stack (32, 46) continuously extends laterally from the first backside trench to the second backside trench at levels below the level(s) of the dielectric isolation structures 72. Each of the at least one electrically conductive layer 46D (e.g., the drain select gate electrodes) located at a level of the dielectric isolation structure 72 within the first alternating stack (32, 46) laterally extends along the second horizontal direction hd2 by a distance that is less than the lateral separation distance between the first backside trench and the second backside trench.

Figure 14A:
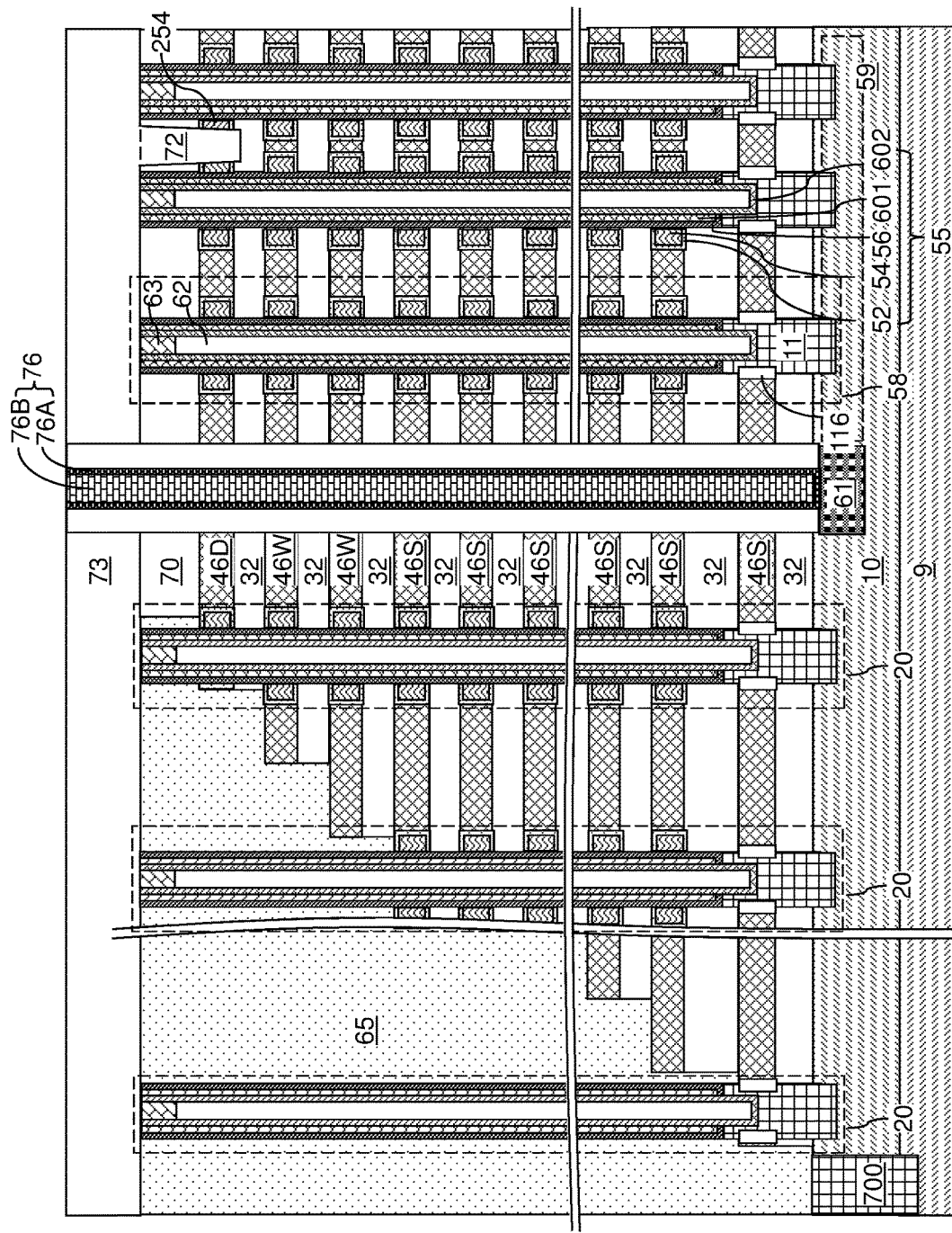
FIG. 14A is a schematic vertical cross-sectional view of the exemplary structure after formation of an insulating spacer and a backside contact structure according to an embodiment of the present disclosure.
Figure 14B:
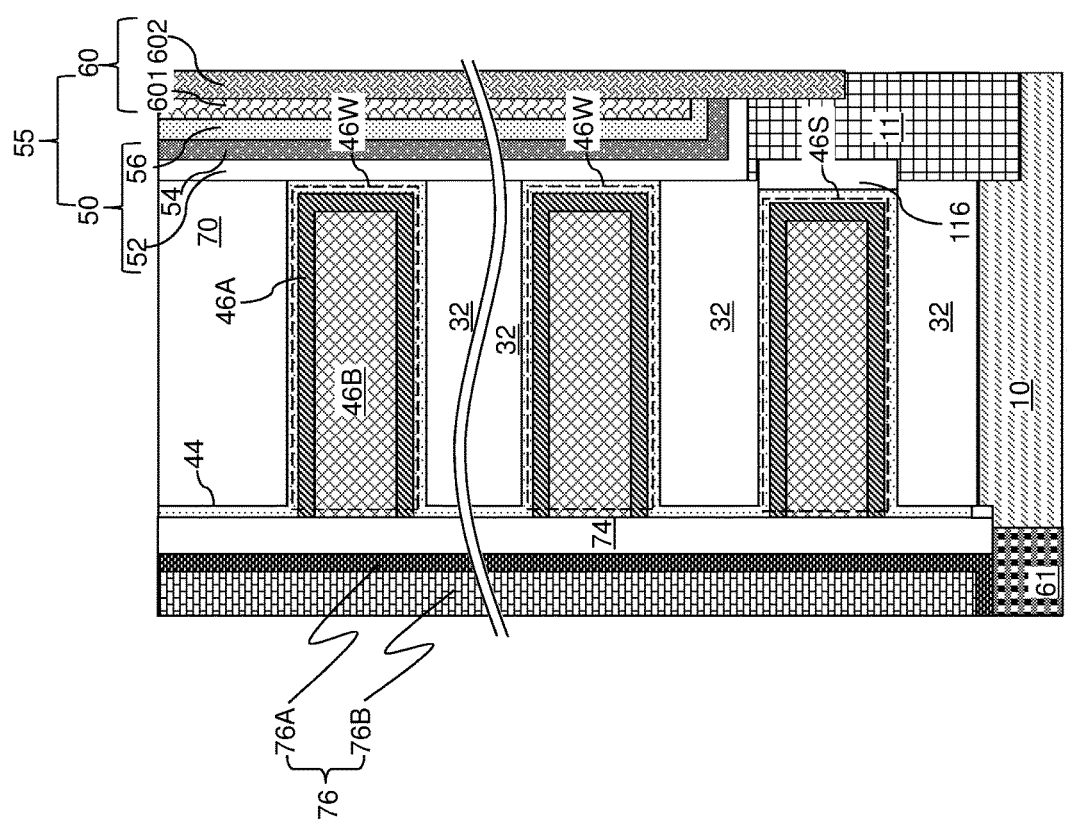
FIG. 14B is a magnified view of a region of the exemplary structure of FIG. 14A.

Referring to FIGS. 14A and 14B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 15A:
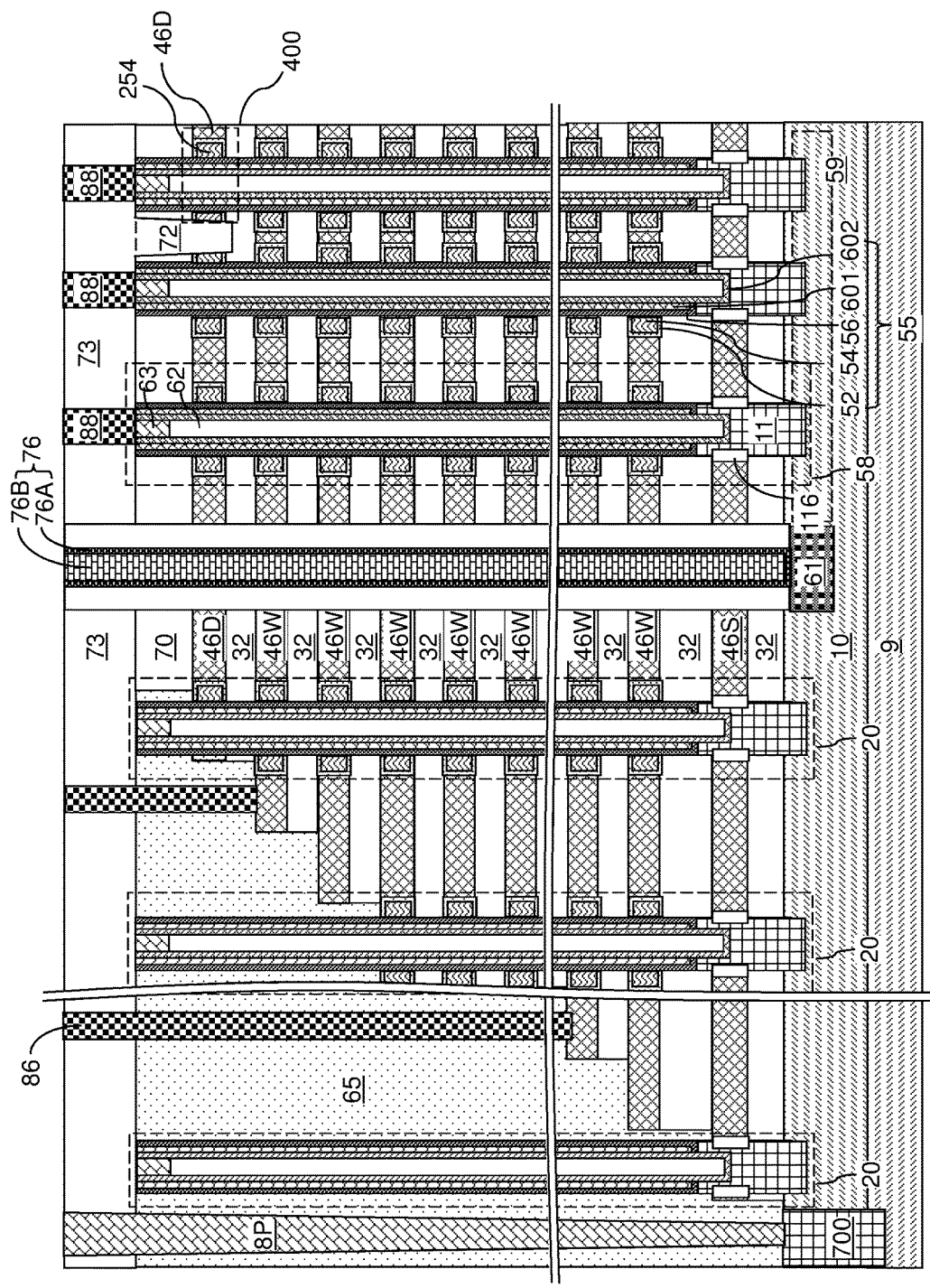
FIG. 15A is a schematic vertical cross-sectional view of the exemplary structure after formation of additional contact via structures according to an embodiment of the present disclosure.
Figure 15B:
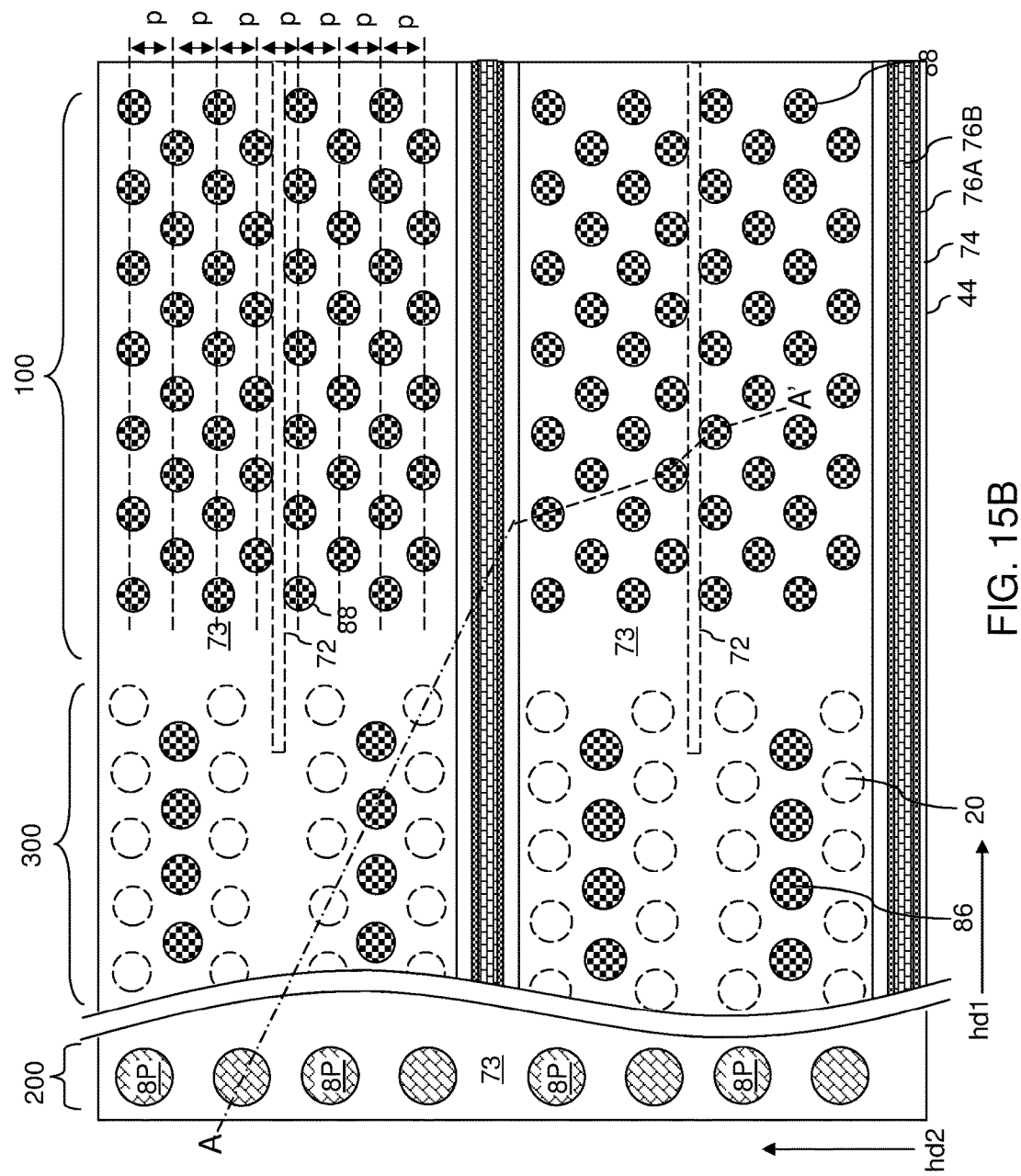
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

According to various embodiments of the present disclosure, a three-dimensional memory device shown in FIG. 15A includes an alternating stack of insulating layers 32 and control gate electrodes 46W located over a substrate (9, 10), a drain select gate device 400 located above the alternating stack (32, 46W), and a vertical semiconductor channel 60 extending through the alternating stack (32, 46W) and through the drain select gate device 400. The drain select gate device 400 contains a floating gate electrode 254 located between the vertical semiconductor channel 60 and a first drain select gate electrode 46D.

In one embodiment, the three-dimensional memory device comprises plural alternating stacks of insulating layers 32 and electrically conductive layers 46 located over the substrate (9, 10). The electrically conductive layers 46 comprise the control gate electrodes 46W, the drain select gate electrode 46D located over the control gate electrodes, and a source select gate electrode 46S located under the control gate electrodes 46W. The device also comprises memory stack structures 55 extending through the alternating stacks (32, 46), wherein each of the memory stack structures 55 comprises floating gate electrodes (54, 254) laterally surrounding a vertical semiconductor channel 60 and spaced from the electrically conductive layers 46 by a respective blocking dielectric 52; a first backside trench 79 and a second backside trench 79 vertically extending between a first alternating stack (32, 46) among the alternating stacks and a pair of neighboring alternating stacks (32, 46) adjacent to the first alternating stack; and at least one dielectric isolation structure 72 embedded within the first alternating stack (32, 46), comprising a dielectric material, and dividing a topmost electrically conductive layer 46 within the first alternating stack (32, 46) into at least two discrete electrically isolated drain select gate electrodes 46D (e.g., first and second drain select gate electrodes).

In one embodiment, a subset of the floating gate electrodes 254 located at a level of the topmost electrically conductive layer 46 (e.g., at the level of the drain select gate electrodes 46D) directly contacts a respective sidewall of the at least one dielectric isolation structure 72.

In one embodiment, a subset of the electrically conductive layers 46 comprising the control gate electrodes 46W within the first alternating stack (32, 46) continuously extend laterally from the first backside trench 79 to the second backside trench 79; and each of the at least two discrete electrically isolated drain select gate electrodes 46D has a lateral extent that is less than one half of a lateral distance between the first backside trench 79 and the second backside trench 79. The first backside trench 79 and the second backside trench 79 laterally extend along a first horizontal direction hd1, and the sidewalls of the at least one dielectric isolation structure 72 that contact the subset of the floating gate electrodes 254 laterally extend along the first horizontal direction hd1. In one embodiment, each of the sidewalls of the at least one dielectric isolation structure 72 that contact the subset of the floating gate electrodes 254 is within a respective two-dimensional plane.

In one embodiment, each floating gate electrode 254 within the subset of the floating gate electrodes directly contacting the respective sidewall of the at least one dielectric isolation structure 72 is partially surrounded by a respective blocking dielectric 52 including a pair of disjoined sidewalls, i.e., sidewalls that do not directly contact each other, that contact a respective one of the at least one dielectric isolation structure 72. In one embodiment, each floating gate electrode 254 within the subset of the floating gate electrodes directly contacting the respective sidewall of the at least one dielectric isolation structure 72 laterally surrounds a respective tunneling dielectric layer 56 that does not directly contact, and is laterally spaced from, the at least one dielectric isolation structure 72.

In one embodiment, all of the memory stack structures 55 extending through the first alternating stack (32, 46) are arranged as rows of memory stack structures 55 having a same inter-row pitch p throughout.

In one embodiment, the subset of the floating gate electrodes 254 directly contacting the respective sidewall of the at least one dielectric isolation structure 72 (i.e., the floating gate electrodes 254 that are cut during formation of the shallow trenches 71) has a smaller horizontal cross-sectional area than another subset of the floating gate electrodes 54 located at levels below the at least one dielectric isolation structure 72 (i.e., the floating gate electrodes 54 located in the word line/control gate electrode levels that are not cut during formation of the shallow trenches 71).

In one embodiment, the first alternating stack (32, 46) comprises a terrace region in which each electrically conductive layer 46W of the first alternating stack (32, 46) below the topmost electrically conductive layer 46D within the first alternating stack (32, 46) laterally extends farther than an overlying electrically conductive layer 46W within the first alternating stack (32, 46); the terrace region includes stepped surfaces of the first alternating stack (32, 46) that continuously extend from a bottommost layer within the first alternating stack (32, 46) to a topmost layer within the first alternating stack (32, 46); and support pillar structures 20 extend through the stepped surfaces and through a retro-stepped dielectric material portion 65 that overlies the stepped surfaces. In one embodiment, the first and second backside trenches 79 and the at least one dielectric isolation structure 72 laterally extend into the retro-stepped dielectric material portion 65; and each of the at least two discrete electrically isolated drain select gate electrodes 46D is contacted by different contact via structures 86.

In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a floating gate electrode 54 at a level of an electrically conductive layer 46W) in a first device level of the array of monolithic three-dimensional NAND strings can be located over another memory cell (as embodied as another portion of the floating gate electrode 54 at a level of another electrically conductive layer 46W) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the floating gate electrode 54). Each charge storage element can be located adjacent to a respective one of the plurality of semiconductor channels (59, 11, 60).

The embodiments of the present disclosure provide a floating gate drain select gate device (SGD) 400 with a partial drain select gate electrode 46D. The area gained from partial drain select gate electrode 46D is used for gate isolation (i.e., grouping). One or more of the present embodiments provide one or more of following non-limiting benefits. First, no additional process is needed for non-programmable smaller diameter SGD formation. This provides additional space for simple SGD grouping/isolation process. Second, the SGD devices do not have to be formed during a separate deposition and patterning step, and the drain select gate electrode 46D and corresponding floating gate 254 can be formed during the same deposition and patterning steps as the word lines 46W and memory cell floating gates 54. This simplifies the process and reduced process cost. Third, the method of the present embodiments may be employed to other drain select gate devices engineered to have controlled charge re-distribution on charge storage node of the select device in a three dimensional NAND array. Because of the nature of immediate charge re-distribution on a floating gate, select devices can be programmed to a desired threshold voltage (Vt) without significant variation between inner and outer drain select gate devices within a string.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and control gate electrodes located over a substrate;
a drain select gate device located above the alternating stack; and
a vertical semiconductor channel extending through the alternating stack and through the drain select gate device,
wherein the drain select gate device comprises a floating gate electrode located between the vertical semiconductor channel and a first drain select gate electrode.

2. The three-dimensional memory device of claim 1, wherein the three-dimensional memory device comprises:
   plural alternating stacks of the insulating layers and electrically conductive layers located over the substrate, wherein the electrically conductive layers comprise the control gate electrodes, the drain select gate electrode located over the control gate electrodes, and source select gate electrode located under the control gate electrodes;
   memory stack structures extending through the plural alternating stacks, wherein each of the memory stack structures comprises floating gate electrodes laterally surrounding a respective vertical semiconductor channel and spaced from the electrically conductive layers by a respective blocking dielectric;
   a first backside trench and a second backside trench vertically extending between a first alternating stack among the plural alternating stacks and a pair of neighboring alternating stacks adjacent to the first alternating stack; and
   at least one dielectric isolation structure comprising a dielectric material embedded within the first alternating stack, and dividing a topmost electrically conductive layer within the first alternating stack into at least two discrete electrically isolated drain select gate electrodes comprising the first drain select gate electrode and a second drain select gate electrode.

3. The three-dimensional memory device of claim 2, wherein:
   a subset of the floating gate electrodes located at a level of the topmost electrically conductive layer directly contacts a respective sidewall of the at least one dielectric isolation structure;
   a subset of the electrically conductive layers comprising the control gate electrodes within the first alternating stack continuously extend laterally from the first backside trench to the second backside trench; and
   each of the at least two discrete electrically isolated drain select gate electrodes has a lateral extent that is less than one half of a lateral distance between the first backside trench and the second backside trench.

4. The three-dimensional memory device of claim 3, wherein:
   the first backside trench and the second backside trench laterally extend along a first horizontal direction;
   the sidewalls of the at least one dielectric isolation structure that contact the subset of the floating gate electrodes laterally extend along the first horizontal direction; and
   each of the sidewalls of the at least one dielectric isolation structure that contact the subset of the floating gate electrodes is within a respective two-dimensional plane.

5. The three-dimensional memory device of claim 3, wherein each floating gate electrode within the subset of the floating gate electrodes directly contacting the respective sidewall of the at least one dielectric isolation structure is partially surrounded by a respective blocking dielectric including a pair of disjoined sidewalls that contact a respective one of the at least one dielectric isolation structure.

6. The three-dimensional memory device of claim 5, wherein each floating gate electrode within the subset of the floating gate electrodes directly contacting the respective sidewall of the at least one dielectric isolation structure laterally surrounds a respective tunneling dielectric layer that does not directly contact, and is laterally spaced from, the at least one dielectric isolation structure.

7. The three-dimensional memory device of claim 3, wherein the subset of the floating gate electrodes directly contacting the respective sidewall of the at least one dielectric isolation structure has a smaller horizontal cross-sectional area than another subset of the floating gate electrodes located at levels below the at least one dielectric isolation structure.

8. The three-dimensional memory device of claim 2, wherein all of the memory stack structures extending through the first alternating stack are arranged as rows of memory stack structures having a same inter-row pitch throughout.

9. The three-dimensional memory device of claim 2, wherein:
   the first alternating stack comprises a terrace region in which each electrically conductive layer of the first alternating stack below the topmost electrically conductive layer within the first alternating stack laterally extends farther than an overlying electrically conductive layer within the first alternating stack;
   the terrace region includes stepped surfaces of the first alternating stack that continuously extend from a bottommost layer within the first alternating stack to a topmost layer within the first alternating stack; and
   support pillar structures extend through the stepped surfaces and through a retro-stepped dielectric material portion that overlies the stepped surfaces.

10. The three-dimensional memory device of claim 9, wherein:
    the first and second backside trenches and the at least one dielectric isolation structure laterally extend into the retro-stepped dielectric material portion; and
    each of the at least two discrete electrically isolated drain select gate electrodes is contacted by different contact via structures.

11. The three-dimensional memory device of claim 2, wherein:
    the three-dimensional memory device comprises a monolithic three-dimensional NAND memory device;
    a subset of the electrically conductive layers located below the at least two discrete electrically isolated drain select gate electrodes comprises, or is electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the control gate electrodes have a strip shape extending substantially parallel to the top surface of the substrate, and the control gate electrodes comprise at least a first control gate electrode located in the first device level and a second control gate electrode located in the second device level.

* * * * *